US012757611B2

(12) United States Patent
Cho et al.

(10) Patent No.: US 12,757,611 B2
(45) Date of Patent: Oct. 6, 2026

(54) DISPLAY DEVICE AND FINGERPRINT SENSOR INCLUDING LIGHT TRANSMITTING PORTIONS

(71) Applicant: Samsung Display Co., LTD., Yongin-si (KR)

(72) Inventors: Hyun Min Cho, Yongin-si (KR); Da Woon Jung, Yongin-si (KR); Kab Jong Seo, Yongin-si (KR); Yu Gwang Jeong, Yongin-si (KR); Yun Jong Yeo, Yongin-si (KR); Yang Ho Jung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 422 days.

(21) Appl. No.: 18/366,809

(22) Filed: Aug. 8, 2023

(65) Prior Publication Data

US 2024/0122029 A1 Apr. 11, 2024

(30) Foreign Application Priority Data

Oct. 7, 2022 (KR) ........................ 10-2022-0128572
Mar. 3, 2023 (KR) ........................ 10-2023-0028280

(51) Int. Cl.
*H10K 59/65* (2023.01)
*G06V 40/13* (2022.01)
(Continued)

(52) U.S. Cl.
CPC ......... *H10K 59/65* (2023.02); *G06V 40/1318* (2022.01); *H10K 59/1201* (2023.02);
(Continued)

(58) Field of Classification Search
CPC ...... H10K 59/65; H10K 59/126; H10K 59/40; H10K 59/879; H10K 59/8792;
(Continued)

(56) References Cited

U.S. PATENT DOCUMENTS 9,829,614 B2 11/2017 Smith et al.
11,361,581 B2 * 6/2022 Park .................. G06V 40/1318
(Continued)

FOREIGN PATENT DOCUMENTS

CN 112817079 A * 5/2021 ......... H10K 59/8792
JP 2020034821 A * 3/2020 ........... H10K 59/877
(Continued)

OTHER PUBLICATIONS

Shen-De Chen et al., "Cap Layer Induced Stress in In As (AI) Ga As Quantum Dots", Journal of Vacuum Science & Technology B (JVSTB), American Vacuum Society, vol. 23, No. 5, pp. 2132-2136, Sep./Oct. 2005 (Total 6 pages).
(Continued)

*Primary Examiner* — Ida M Soward
(74) *Attorney, Agent, or Firm* — F. CHAU & ASSOCIATES, LLC

(57) ABSTRACT

A display device includes a substrate, a light emitting element layer disposed on the substrate and including a plurality of light emitting areas each including a light emitting element that emits light, an encapsulation layer disposed on the light emitting element layer, and a light control layer disposed on the encapsulation layer, wherein the light control layer includes a light transmitting film that transmits the light and a light blocking film that blocks the light, and the light transmitting film includes, a first light transmitting portion overlapping the light blocking film in a thickness direction of the substrate, and a plurality of second light transmitting portions each surrounded by the light blocking film, and a thickness of the light blocking film is greater than a thickness of the first light transmitting portion.

16 Claims, 28 Drawing Sheets

(51) Int. Cl.

| | |
|---|---|
| ***H10K 59/12*** | (2023.01) |
| ***H10K 59/126*** | (2023.01) |
| ***H10K 59/40*** | (2023.01) |
| *H10K 50/844* | (2023.01) |
| *H10K 50/86* | (2023.01) |
| *H10K 59/122* | (2023.01) |
| *H10K 59/124* | (2023.01) |

(52) U.S. Cl.
CPC ........... *H10K 59/126* (2023.02); *H10K 59/40* (2023.02); *H10K 50/844* (2023.02); *H10K 50/865* (2023.02); *H10K 59/12* (2023.02); *H10K 59/122* (2023.02); *H10K 59/124* (2023.02)

(58) Field of Classification Search
CPC .... H10K 59/873; H10K 59/12; H10K 59/124; H10K 59/122; H10K 50/865; H10K 50/844; G06V 40/1318
See application file for complete search history.

(56) References Cited

U.S. PATENT DOCUMENTS

| | | | | |
|---|---|---|---|---|
| 2018/0373945 | A1* | 12/2018 | Wu | G06V 40/1324 |
| 2020/0380239 | A1* | 12/2020 | Lee | H10K 59/131 |
| 2021/0210557 | A1 | 7/2021 | Lim et al. | |
| 2021/0357613 | A1* | 11/2021 | Lim | G06V 40/1318 |
| 2021/0399025 | A1* | 12/2021 | Lee | H01L 25/18 |
| 2022/0052120 | A1* | 2/2022 | Park | G02B 5/201 |
| 2022/0131018 | A1* | 4/2022 | Jeon | H10K 59/65 |

FOREIGN PATENT DOCUMENTS

| | | | | |
|---|---|---|---|---|
| JP | 2020184208 A | * 11/2020 | | G06V 40/1318 |
| KR | 10-2011-0094455 | 8/2011 | | |
| KR | 10-2020-0063591 | 6/2020 | | |
| KR | 10-2021-0084096 | 7/2021 | | |

OTHER PUBLICATIONS

Extended European Search Report for European Application No. 23198723.1, dated Feb. 21, 2024.

* cited by examiner

DISPLAY DEVICE AND FINGERPRINT SENSOR INCLUDING LIGHT TRANSMITTING PORTIONS

CROSS-REFERENCE TO RELATED APPLICATION(S)

This application claims priority to and benefits of Korean Patent Application No. 10-2022-0128572 filed on Oct. 7, 2022, and 10-2023-0028280 filed on Mar. 3, 2023, under 35 U.S.C. § 119, in the Korean Intellectual Property Office, the entire contents of which are incorporated herein by reference.

BACKGROUND

1. Technical Field

Embodiments relate to a display device, a method for manufacturing the display device, and a fingerprint sensor.

2. Description of the Related Art

As an information society develops, the demand for a display device for displaying an image has been increased in various fields. The display device may be a flat panel display, such as a liquid crystal display, a field emission display, or a light emitting display panel. The light emitting display device may include an organic light emitting diode display device including an organic light emitting diode element as a light emitting element or a light emitting diode display device including an inorganic light emitting diode element such as a light emitting diode (LED) as a light emitting element.

In the case of a vehicle display device, when an image displayed on the vehicle display device disposed in front of a driver or a passenger is reflected on a windshield at night, it may interfere with the driver's driving, and therefore, it is necessary to control a viewing angle of the image displayed on the vehicle display device. For example, in order to protect privacy, it is necessary to control the viewing angle of the image displayed on the vehicle display device so that the image displayed on the vehicle display device disposed in front of the driver is not provided to the passenger.

The display device may include a fingerprint sensor for fingerprint authentication. The fingerprint sensor may be implemented by an optical method, an ultrasonic method, or a capacitive method. The optical fingerprint sensor may include a light sensing unit that senses light, and a collimator having an opening that provides light to the light sensing unit and a light blocking unit that blocks light.

In case that the fingerprint sensor is disposed in a bezel area or a non-display area of the display device, there is a limit to expanding a display area of the display device. Therefore, the fingerprint sensor is recently disposed in the display area of the display device. Since the fingerprint sensor is disposed on a lower side of a display panel, the amount of light incident to the light sensing unit of the fingerprint sensor may be small. However, in case that an area of the light blocking unit of collimator is reduced to increase the amount of light incident on the light sensing unit of the fingerprint sensor, noise light incident on the light sensing unit may increase. Thus, fingerprint recognition accuracy may be lowered.

SUMMARY

Aspects of the disclosure provide a display device capable of improving light characteristics by forming a light control layer that simultaneously minimizes a thickness and a viewing angle.

Aspects of the disclosure also provide a method for manufacturing a display device having improved process efficiency.

Aspects of the disclosure provide a fingerprint sensor having improved fingerprint recognition accuracy by removing noise light.

However, aspects of the disclosure are not restricted to those set forth herein. The above and other aspects of the disclosure will become more apparent to one of ordinary skill in the art to which the disclosure pertains by referencing the detailed description of the disclosure given below.

According to an aspect of the disclosure, a display device may include a substrate, a light emitting element layer disposed on the substrate and including a plurality of light emitting areas each including a light emitting element that emits light, an encapsulation layer disposed on the light emitting element layer, and a light control layer disposed on the encapsulation layer, wherein the light control layer may include a light transmitting film that transmits the light, and a light blocking film that blocks the light, and the light transmitting film may include, a first light transmitting portion overlapping the light blocking film in a thickness direction of the substrate, and a plurality of second light transmitting portions each surrounded by the light blocking film, and a thickness of the light blocking film is greater than a thickness of the first light transmitting portion.

In an embodiment, a first width, which is a width of each of the plurality of second light transmitting portions in a first direction, may be greater than a first distance, which is a distance between two adjacent second light transmitting portions among the plurality of second light transmitting portions in the first direction.

In an embodiment, a ratio of the first distance to the first width may be substantially equal to a ratio of the thickness of the first light transmitting portion to the thickness of the light blocking film.

In an embodiment, the ratio of the first distance to the first width may be about 1:9 to about 2:3.

In an embodiment, the first width may be about 6 μm to about 9 μm, and the first distance may be about 1 μm to about 4 μm.

In an embodiment, the thickness of the light blocking film may be about 10 μm to about 25 μm, and the thickness of the first light transmitting portion may be about 2 μm to about 8 μm.

In an embodiment, the light transmitting film may have a refractive index in a range of about 1.1 to about 1.6.

In an embodiment, the light blocking film may include a light blocking organic material, and the light transmitting film may include a transparent organic material.

In an embodiment, the display device may further include a third light transmitting portion, wherein the third light transmitting portion may be disposed on the light blocking film and overlap the light blocking film in the thickness direction of the substrate.

In an embodiment, the third light transmitting portion may be made of photoresist or a transparent conductive oxide.

In an embodiment, the thickness of the light blocking film may be smaller than a thickness of each of the plurality of second light transmitting portions.

In an embodiment, the display device may further include a touch layer, wherein the touch layer may be disposed between the encapsulation layer and the light control layer and include a plurality of touch electrodes, and the light blocking film may overlap the plurality of touch electrodes in the thickness direction of the substrate.

In an embodiment, the display device may further include light blocking pattern layers, wherein the light blocking pattern layers may respectively overlap the light blocking film in the thickness direction of the substrate, and the light blocking pattern layers may be positioned on an opposite side of the light blocking film with the first light transmitting portion disposed between the light blocking pattern layers and the opposite side of the light blocking film.

In an embodiment, the light blocking pattern layers may include at least one of Mo, Al, Ti, W, Ag, Cu, and Au.

In an embodiment, the light blocking film may not overlap the plurality of light emitting areas in the thickness direction of the substrate.

According to an aspect of the disclosure, a method for manufacturing a display device, the method may include, providing a display panel including a light emitting element layer, forming a light transmitting layer on the display panel, forming a light blocking layer on the light transmitting layer, forming a mask pattern layer on the light blocking layer, forming a light blocking film and a first light transmitting portion each including openings by etching the light blocking layer and the light transmitting layer by using the mask pattern layer, removing the mask pattern layer, and forming a plurality of second light transmitting portions by filling or depositing an organic material in the openings of the light blocking film and the openings of the first light transmitting portion.

In an embodiment, the first light transmitting portion may overlap the light blocking film and may not overlap each of the plurality of second light transmitting portions.

According to an aspect of the disclosure, a method for manufacturing a display device, the method may include, providing a display panel including a light emitting element layer, forming a first light transmitting portion on the display panel, forming a light blocking layer on the first light transmitting portion, forming a mask pattern layer on the light blocking layer, forming a light blocking film including openings by etching the light blocking layer by using the mask pattern layer, removing the mask pattern layer, and forming a plurality of second light transmitting portions by filling or depositing an organic material in the openings of the light blocking film.

In an embodiment, the first light transmitting portion may overlap each of the plurality of second light transmitting portions and the light blocking film.

According to an aspect of the disclosure, a fingerprint sensor may include, a light sensing layer including a light sensing element that generates a sensing current according to incident light, and a light control layer disposed on the light sensing layer, wherein the light control layer may include, first light transmitting portions spaced apart from each other, light blocking films respectively overlapping the first light transmitting portions in a thickness direction, and second light transmitting portions disposed between the first light transmitting portions and between the light blocking films, and a thickness of each of the light blocking films may be greater than a thickness of each of the first light transmitting portions.

According to the display device according to an embodiment, optical characteristics may be improved by including a light control layer that simultaneously minimizes a thickness and a viewing angle.

According to the method for manufacturing a display device according to an embodiment, process efficiency may be improved.

According to the fingerprint sensor according to an embodiment, fingerprint recognition accuracy may be improved by removing noise light.

However, the effects of the embodiments are not restricted to the one set forth herein. The above and other effects of the embodiments will become more apparent to one of daily skill in the art to which the embodiments pertain by referencing the claims.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1A:
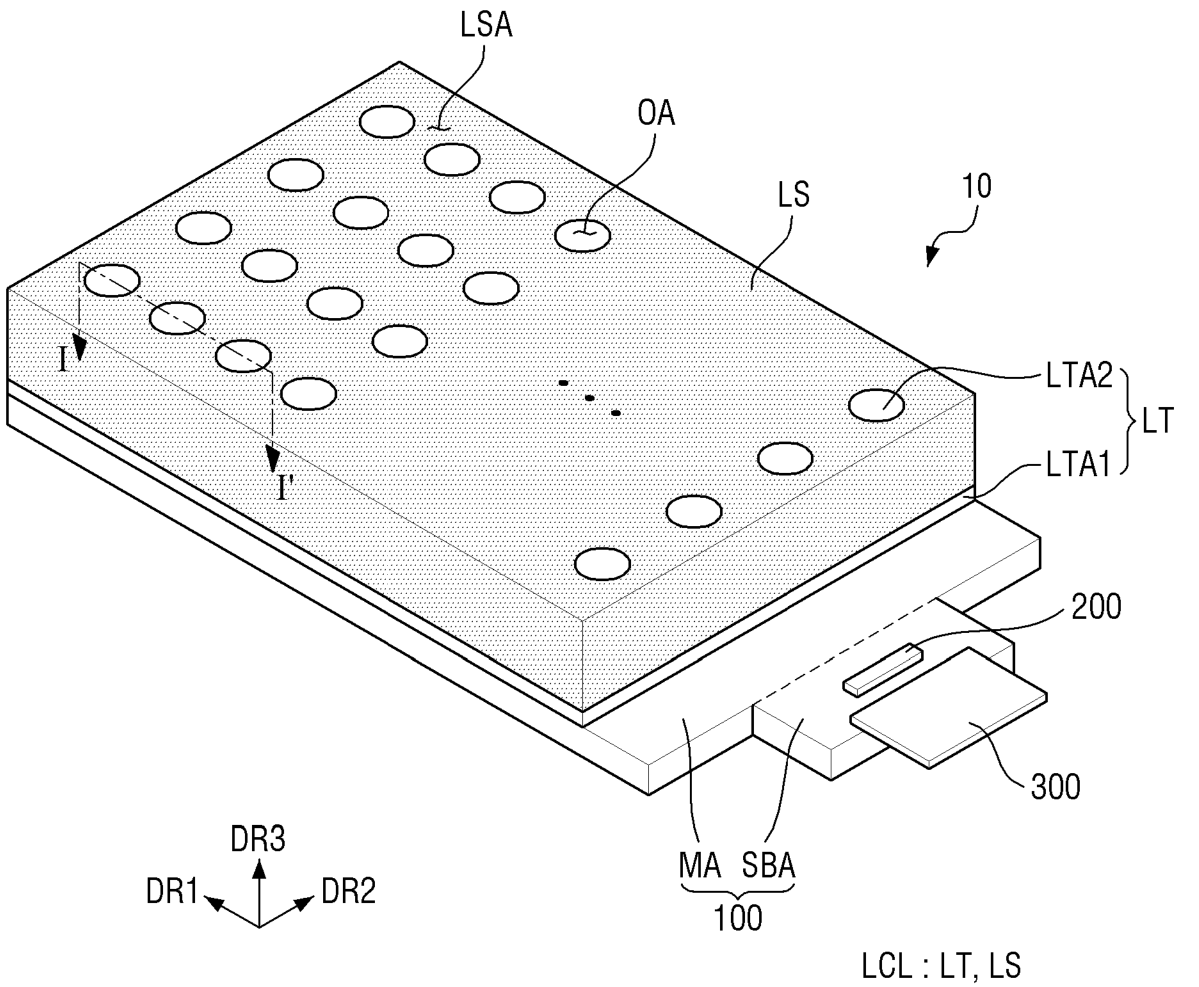
FIG. 1A is a schematic perspective view illustrating a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Hereinafter, detailed embodiments will be described with reference to the accompanying drawings.

Figure 1B:
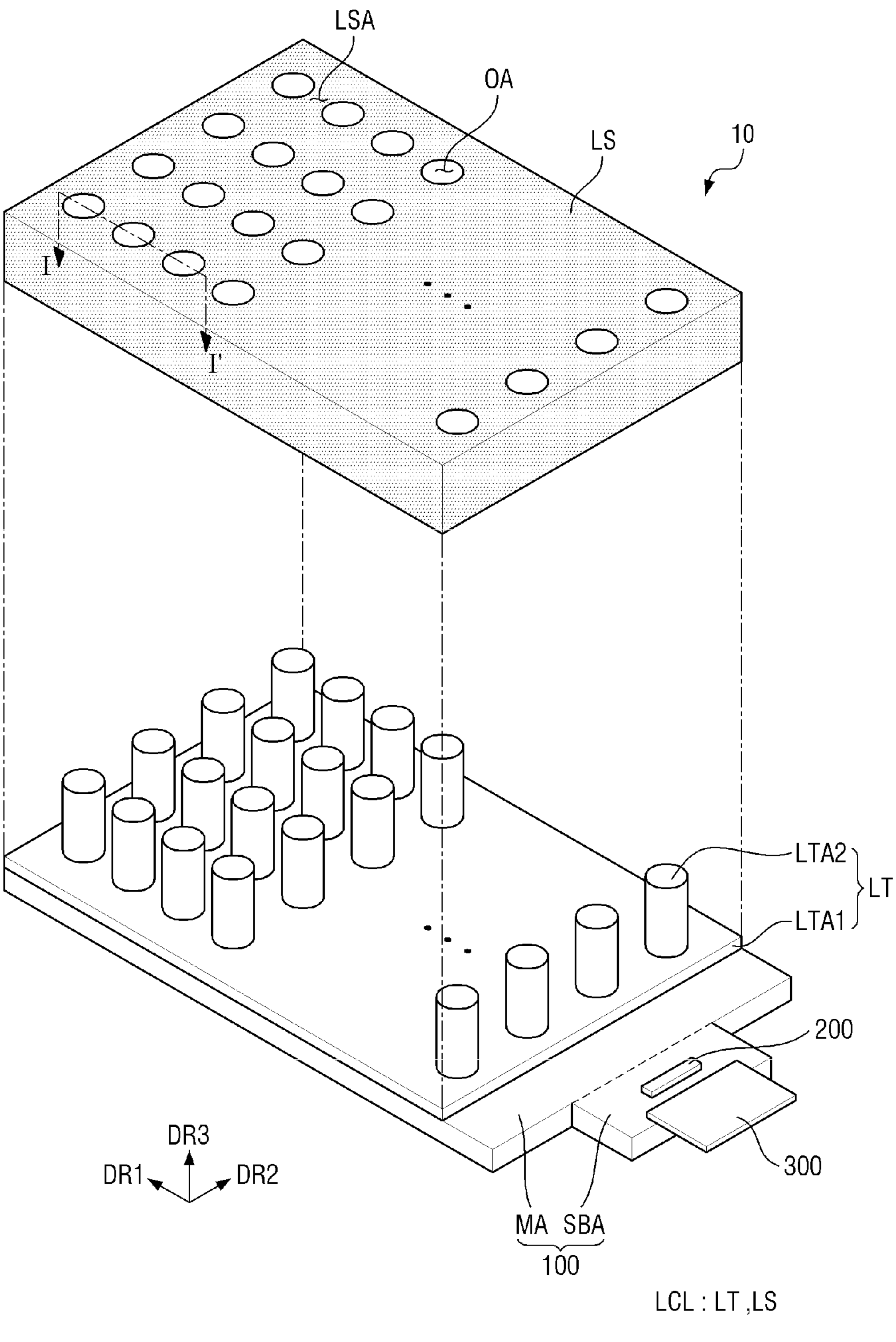
FIG. 1B is an exploded schematic perspective view illustrating the display device according to an embodiment.
Figure 2:
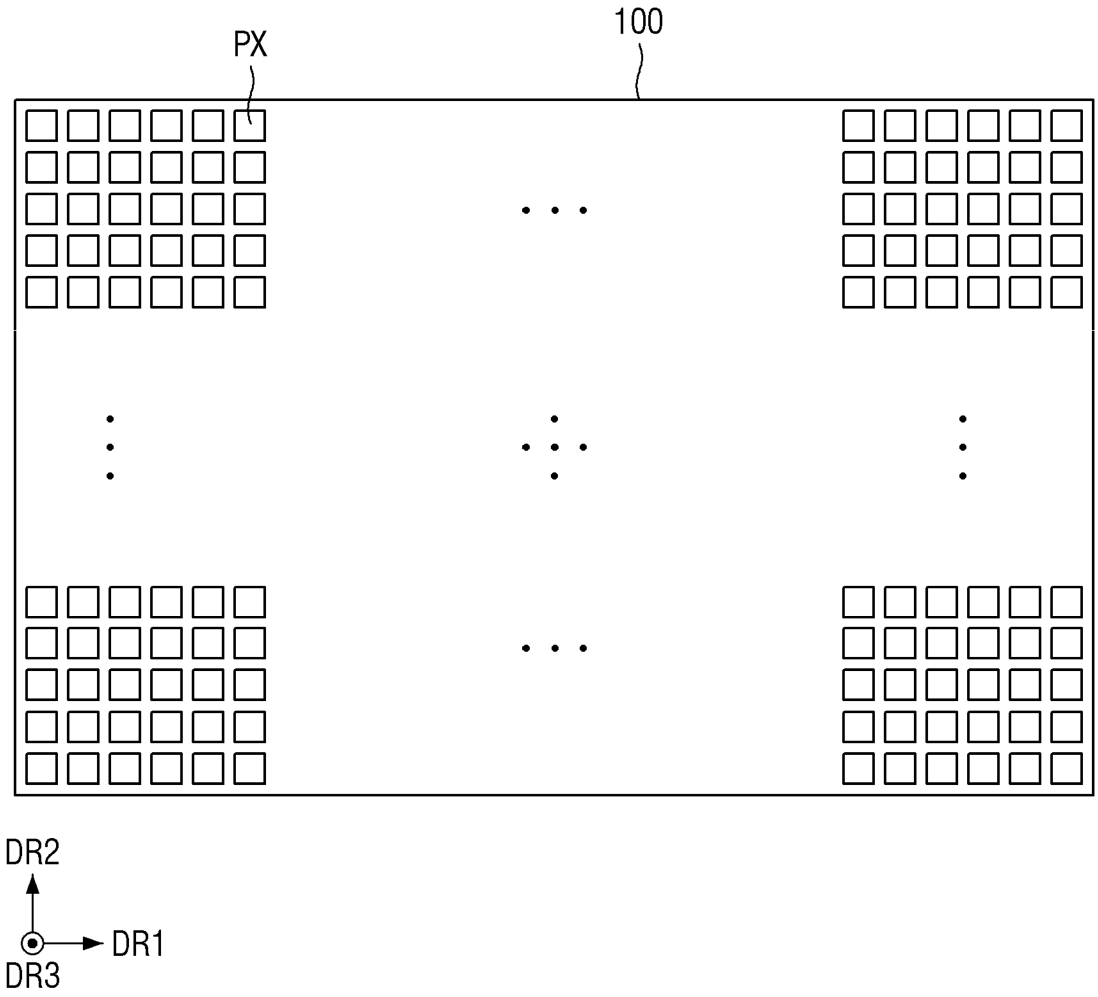
FIG. 2 is a schematic plan view illustrating a display panel according to an embodiment.
Figure 3:
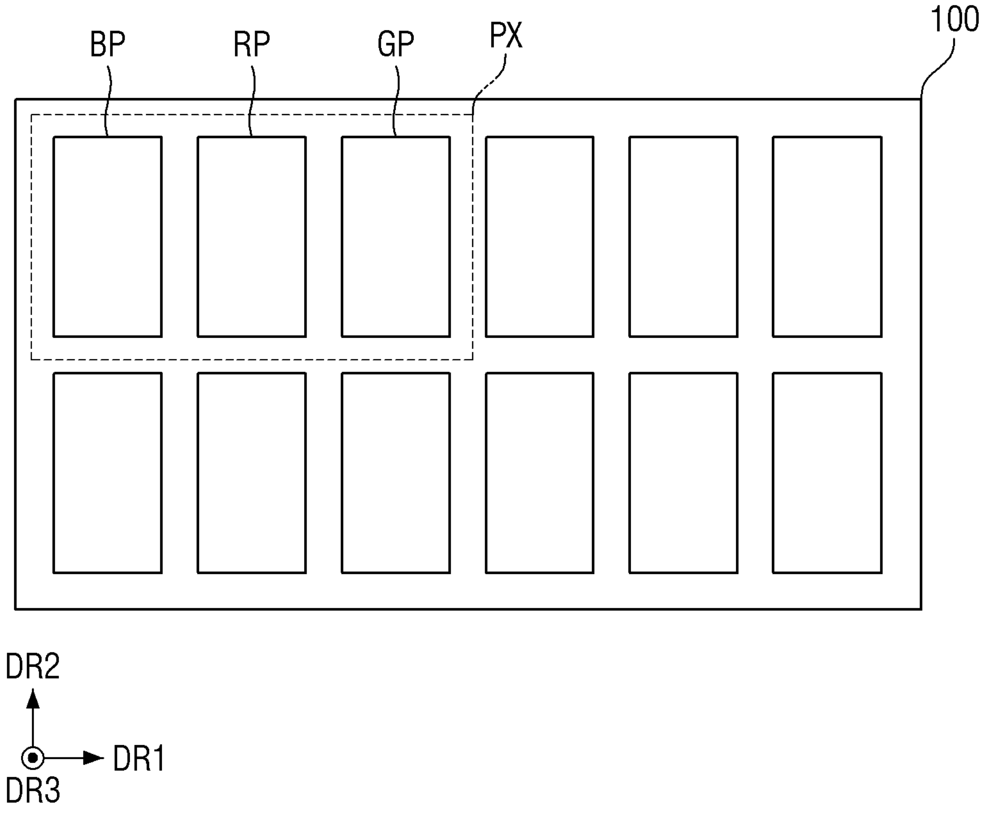
FIG. 3 is a schematic plan view illustrating pixels according to an embodiment.

FIG. 1A is a schematic perspective view illustrating a display device according to an embodiment. FIG. 1B is an exploded schematic perspective view illustrating the display device according to an embodiment. FIG. 2 is a schematic plan view illustrating a display panel according to an embodiment. FIG. 3 is a schematic plan view illustrating pixels according to an embodiment.

Referring to FIGS. 1A, 1B, 2, and 3, a display device 10 may be a device that displays a moving image or a still image, and may be used as a display screen of each of various products such as televisions, laptop computers, monitors, billboards, and Internet of Things (IoT) as well as portable electronic devices such as mobile phones, smartphones, tablet personal computers (PCs), smartwatches, watch phones, mobile communication terminals, electronic organizers, electronic books, portable multimedia players (PMPs), vehicle displays, and ultra mobile PCs (UMPCs).

The display device 10 may be a light emitting display device such as an organic light emitting display device with an organic light emitting diode, a quantum dot light emitting display device including a quantum dot light emitting layer, an inorganic light emitting display device including an inorganic semiconductor, and a micro light emitting display device with a micro light emitting diode (LED). Hereinafter, it is described that the display device 10 is the organic light emitting display device, but embodiments are not limited thereto.

The display device 10 may include a display panel 100, a display driving circuit 200, a circuit board 300, and a light control layer LCL.

The display panel 100 may be formed in a rectangular plane having a long side in a first direction DR1 and a short side in a second direction DR2 intersecting the first direction DR1. A corner portion where the long side in the first direction DR1 and the short side in the second direction DR2 meet may be rounded to have a certain curvature or may be formed at a right angle. The planar shape of the display panel 100 is not limited to the quadrangular shape, and may be other polygonal shapes, a circular shape, or an elliptical shape. The display panel 100 may be formed to be flat, but embodiments are not limited thereto. For example, the display panel 100 may include curved surface portions formed at left and right distal ends thereof and having a constant curvature or a variable curvature. For example, the display panel 100 may be flexibly formed to be curved, bent, folded, or rolled.

In the illustrated drawings, the first direction DR1 and the second direction DR2 are horizontal directions, respectively, and intersect each other. For example, the first direction DR1 and the second direction DR2 may be orthogonal to each other. For example, a third direction DR3 may be a vertical direction intersecting the first direction DR1 and the second direction DR2, for example, orthogonal to the first direction DR1 and the second direction DR2.

Each of the pixels PX may include sub-pixels RP, GP, and BP as illustrated in FIG. 3. It is illustrated in FIG. 3 that each of the pixels PX includes three sub-pixels RP, GP, and BP, e.g., a first sub-pixel BP, a second sub-pixel RP, and a third sub-pixel GP, but embodiments are not limited thereto. Further, it is illustrated in FIG. 3 that the sub-pixels BP, RP, and GP are arranged along the first direction DR1, but the sub-pixels are not limited thereto and the order thereof may also be changed.

Each of the first sub-pixel BP, the second sub-pixel RP, and the third sub-pixel GP may have a rectangular, square, or rhombus planar shape. For example, each of the first sub-pixel BP, the second sub-pixel RP, and the third sub-pixel GP may have a rectangular planar shape having a short side in the first direction DR1 and a long side in the second direction DR2 as illustrated in FIG. 3.

In some embodiments, each of the first sub-pixel BP, the second sub-pixel RP, and the third sub-pixel GP may have a square or rhombus planar shape including sides having the same length in the first direction DR1 and the second direction DR2.

As illustrated in FIG. 3, the first sub-pixel BP, the second sub-pixel RP, and the third sub-pixel GP may be arranged in the first direction DR1. In another example, any one of the second sub-pixel RP and the third sub-pixel GP and the first sub-pixel BP may be arranged in the first direction DR1, and the other one of the second sub-pixel RP and the third sub-pixel GP and the first sub-pixel BP may be arranged in the second direction DR2. For example, the first sub-pixel BP and the second sub-pixel RP may be arranged in the first direction DR1, and the first sub-pixel BP and the third sub-pixel GP may be arranged in the second direction DR2.

In another example, any one of the first sub-pixel BP and the third sub-pixel GP and the second sub-pixel RP may be arranged in the first direction DR1, and the other one of the first sub-pixel BP and the third sub-pixel GP and the second sub-pixel RP may be arranged in the second direction DR2. In another example, any one of the first sub-pixel BP and the second sub-pixel RP and the third sub-pixel GP may be arranged in the first direction DR1, and the other one of the first sub-pixel BP and the second sub-pixel RP and the third sub-pixel GP may be arranged in the second direction DR2.

The first sub-pixel BP may emit first light, the second sub-pixel RP may emit second light, and the third sub-pixel GP may emit third light. For example, the first light may be light in a blue wavelength band, the second light may be light in a red wavelength band, and the third light may be light in a green wavelength band. The red wavelength band may be a wavelength band of about 600 nm to about 750 nm, the green wavelength band may be a wavelength band of about 480 nm to about 560 nm, and the blue wavelength band may be a wavelength band of about 370 nm to about 460 nm, but embodiments are not limited thereto.

Each of the first sub-pixel BP, the second sub-pixel RP, and the third sub-pixel GP may include at least one of an organic light emitting element including an organic material, an inorganic light emitting element including an inorganic semiconductor, a quantum dot light emitting element including a quantum dot light emitting layer, and a micro light emitting diode (micro LED), as a light emitting element that emits light. Hereinafter, it is described that each of the first sub-pixel BP, the second sub-pixel RP, and the third sub-pixel GP includes the organic light emitting element, but embodiments are not limited thereto.

As illustrated in FIGS. 2 and 3, an area (or size) of the first sub-pixel BP, an area (or size) of the second sub-pixel RP, and an area (or size) of the third sub-pixel GP may be substantially the same as each other, but embodiments are not limited thereto. At least one of the area (or size) of the first sub-pixel BP, the area (or size) of the second sub-pixel RP, and the area (or size) of the third sub-pixel GP may be different from the other one. In another example, any two of the area (or size) of the first sub-pixel BP, the area (or size)

of the second sub-pixel RP, and the area (or size) of the third sub-pixel GP may be substantially the same as each other, and the other one may be different from the two areas. In another example, the area (or size) of the first sub-pixel BP, the area (or size) of the second sub-pixel RP, and the area (or size) of the third sub-pixel GP may be different from each other.

The display panel 100 may further include a main area and a sub-area.

The main area MA may include a display area displaying an image and a non-display area that is a peripheral area of the display area. The display area may include display pixels displaying an image. The non-display area may be defined as an area from the outside of the display area to an edge portion of the display panel 100.

The sub-area SBA may protrude from a side of the main area MA in the first direction DR1. A length of the sub-area SBA in the first direction DR1 may be smaller than a length of the main area MA in the first direction DR1, and a length of the sub-area SBA in the second direction DR2 may be smaller than a length of the main area MA in the second direction DR2, but embodiments are not limited thereto.

It is illustrated in FIGS. 1A and 1B that the sub-area SBA is unfolded, but the sub-area SBA may be bent, and the sub-area SBA may be disposed on a lower surface of the display panel 100. In case that the sub-area SBA is bent, the sub-area SBA may overlap the main area MA in a thickness direction, e.g., in the third direction DR3. The display driving circuit 200 may be disposed in the sub-area SBA.

The display driving circuit 200 may generate signals and voltages for driving the display panel 100. The display driving circuit 200 may be formed as an integrated circuit (IC) and may be attached onto the display panel 100 by a chip on glass (COG) method, a chip on plastic (COP) method, or an ultrasonic bonding method, but embodiments are not limited thereto. For example, the display driving circuit 200 may be attached onto the circuit board 300 in a chip on film (COF) manner.

The circuit board 300 may be attached to an end portion of the display panel 100 by using an anisotropic conductive film (ACF). Therefore, the circuit board 300 may be electrically connected to the display panel 100 and the display driving circuit 200. The display panel 100 and the display driving circuit 200 may receive digital video data, timing signals, and driving voltages through the circuit board 300. The circuit board 300 may be a flexible film such as a flexible printed circuit board, a printed circuit board, or a chip on film.

The light control layer LCL may be disposed on the display panel 100. The light control layer LCL may be disposed in the display area of the main area MA.

The light control layer LCL may include opening areas OA arranged in the first and second directions DR1 and DR2 and a non-opening area LSA surrounding the opening areas OA. The opening areas OA are areas that transmit light, and may be areas that extend along the third direction DR3 and penetrate through a light blocking film LS and a light transmitting film LT. Each of the opening areas OA may have a circular shape in plan view as illustrated in FIGS. 1A and 1B, but embodiments are not limited thereto. Each of the opening areas OA may have an elliptical or polygonal shape in plan view. The non-opening area LSA may be a remaining area of the light control layer LCL excluding the opening area OA. The opening areas OA may refer to areas overlapping an area in which a second light transmitting portion LTA2 is disposed in the third direction DR3, and the non-opening area LSA may refer to an area overlapping an area in which the second light transmitting portion LTA2 is not disposed in the third direction DR3.

The light control layer LCL may include a light transmitting film LT that transmits light emitted from the display panel 100 and a light blocking film LS that blocks light emitted from the display panel 100. The light transmitting film LT may include a first light transmitting portion LTA1 disposed in the non-opening area LSA and second light transmitting portions LTA2 disposed in the opening area OA. The light blocking film LS may be disposed in the non-opening area LSA.

The light control layer LCL will be described below with reference to FIG. 6 and the like.

Figure 4:
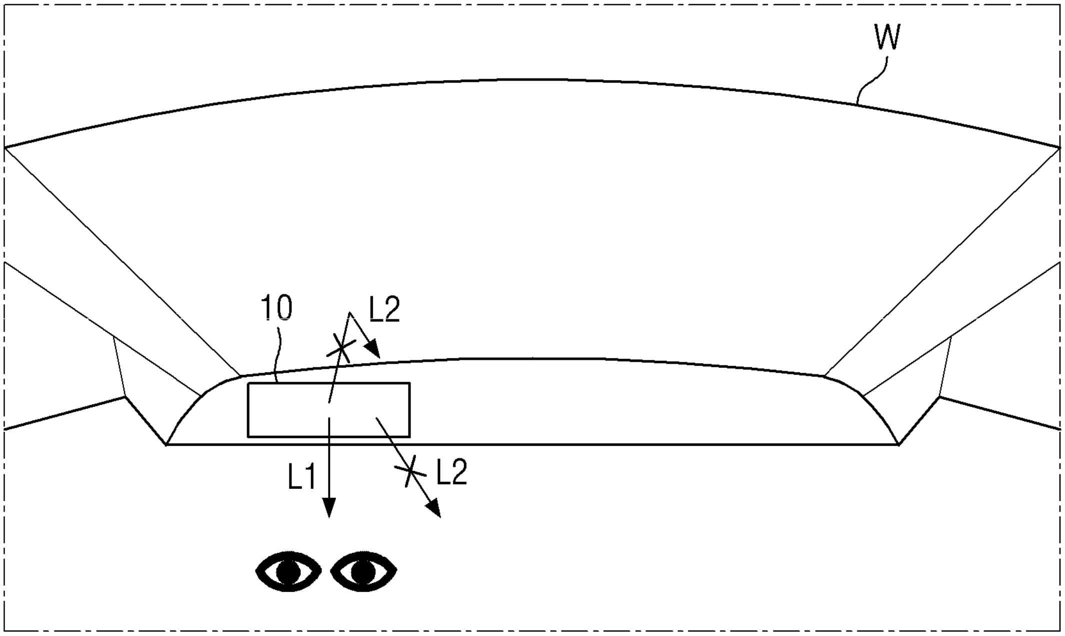
FIG. 4 is a schematic view of a display device applied to a vehicle according to an embodiment.

FIG. 4 is a schematic view in case that the display device according to an embodiment is applied to a vehicle.

Referring to FIG. 4, the display device 10 according to an embodiment may be, for example, a display device applied to a vehicle. The vehicle may include a body forming an exterior of the vehicle and an interior space defined by the body. The body may include a windshield W that protects a driver and passengers from the outside and provides visibility to the driver. As illustrated in FIG. 4, the display device 10 may be provided in the interior space.

In an embodiment, the display device 10 may be disposed on a dashboard provided in the interior space. For example, the display device 10 may be disposed on the dashboard in front of a driver's seat to provide speed information to the driver, or may be disposed on the dashboard in front of a passenger's seat to provide entertainment information to the passenger, or may be disposed at the center portion of the dashboard to provide map information and the like. FIG. 4 illustratively illustrates the display device 10 disposed on the dashboard in front of the driver's seat and the driver viewing a display screen of the display device 10.

The driver may recognize (or visually recognize) the display screen of the display device 10 through light L1 emitted from the display device 10 towards the driver. However, some light L2 of the light emitted from the display device 10 may be reflected on the windshield W and provided to the driver. For example, an image reflected on the windshield W may interfere with driver's driving. However, in the display device 10 according to an embodiment, it is possible to prevent in advance that some light L2 of the light emitted from the display device 10 is reflected on the surrounding windshield W and provided to the driver by adjusting viewing angles of the light L1 and L2 emitted from the display device 10 in the frontal direction (e.g., a direction toward the driver), e.g., vertical viewing angles.

Also, some light L2 of the light emitted from the display device 10 may be provided toward the passenger. For example, the display device 10 may be vulnerable to privacy protection. However, in the display device 10 according to an embodiment, the image displayed on the vehicle display device disposed in front of a driver may be prevented from being provided to the passenger by adjusting the viewing angles of the light L1 and L2 emitted from the display device 10 in the frontal direction (the direction toward the driver), e.g., the vertical viewing angles.

The viewing angle may be adjusted through the light transmitting film LT and the light blocking film LS. The viewing angle may be limited to a certain angle range through the light transmitting film LT and the light blocking film LS. As an example, in case that a virtual line facing the driver in front and extending in a direction perpendicular to a display surface of the display device 10 is taken as a normal line, the viewing angle may be an angle within 30° from the normal line.

Figure 5:
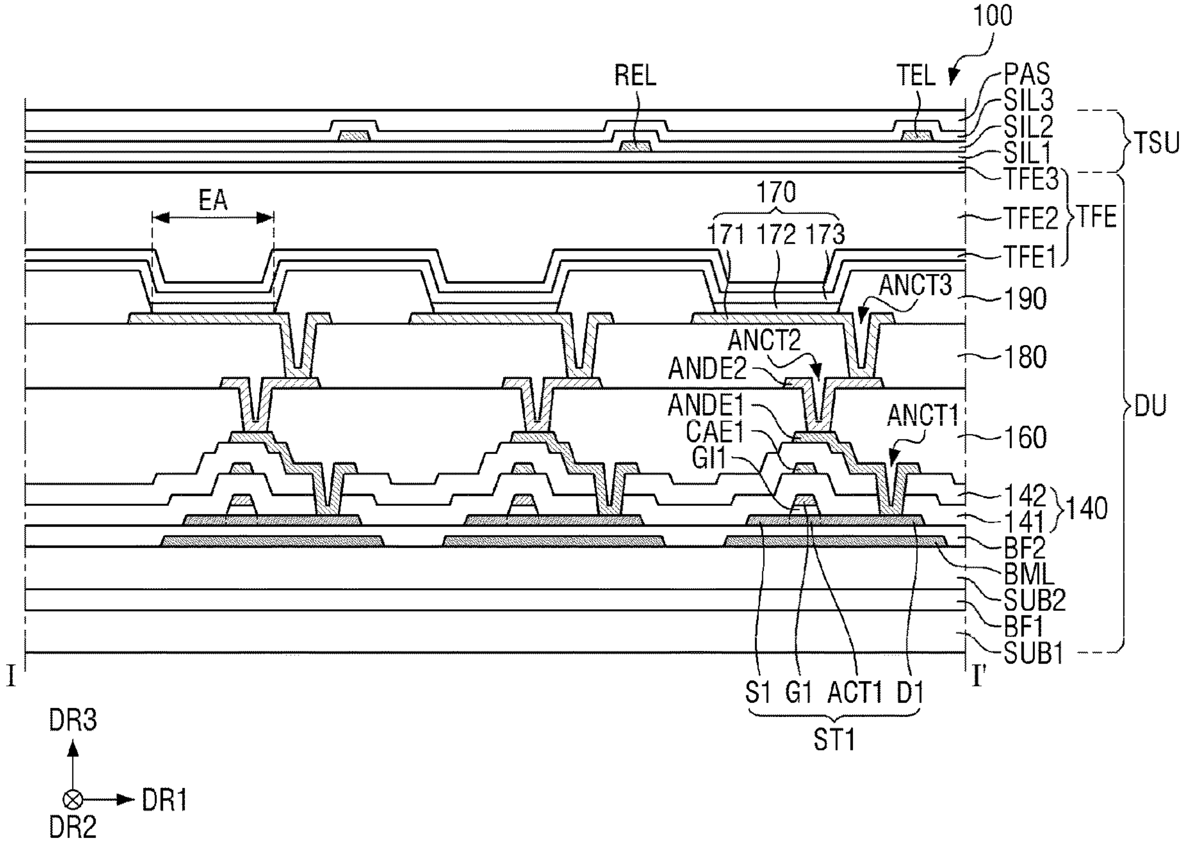
FIG. 5 is a schematic cross-sectional view of a display panel taken along line I-I' of FIG. 1A.

FIG. 5 is a schematic cross-sectional view of a display panel taken along line I-I' of FIG. 1A.

Referring to FIG. 5, the display panel 100 may include a display layer DU and a touch sensing layer TSU (e.g., a touch layer).

The display layer DU may include a first substrate SUB1, a first buffer film BF1, a second substrate SUB2, a lower metal layer BML, a second buffer film BF2, a first thin film transistor ST1, a first gate insulating film GI1, a first interlayer insulating film 141, a first capacitor electrode CAE1, a second interlayer insulating film 142, a first anode connection electrode ANDE1, a first organic film 160, a second anode connection electrode ANDE2, a second organic film 180, a light emitting element 170, a bank 190, and an encapsulation layer TFE.

The first buffer film BF1 may be disposed on the first substrate SUB1, the second substrate SUB2 may be disposed on the first buffer film BF1, and the second buffer film BF2 may be disposed on the second substrate SUB2.

Each of the first substrate SUB1 and the second substrate SUB2 may be formed of an insulating material such as a polymer resin. For example, the first substrate SUB1 and the second substrate SUB2 may include polyimide. Each of the first substrate SUB1 and the second substrate SUB2 may be a flexible substrate that is bendable, foldable, rollable, or the like.

Each of the first buffer film BF1 and the second buffer film BF2 may be a film for protecting the first thin film transistor ST1 and the light emitting layer 172 from moisture permeating through the first and second substrates SUB1 and SUB2, which are vulnerable to moisture permeation. Each of the first buffer film BF1 and the second buffer film BF2 may include inorganic films alternately stacked. For example, each of the first buffer film BF1 and the second buffer film BF2 may be formed as a multilayer film in which one or more inorganic films of a silicon nitride layer, a silicon oxynitride layer, a silicon oxide layer, a titanium oxide layer, and an aluminum oxide layer are alternately stacked.

The lower metal layer BML may be disposed on the second substrate SUB2. The lower metal layer BML may be disposed to overlap a first active layer ACT1 of the first thin film transistor ST1 in the third direction DR3 to prevent leakage current from occurring in case that light is incident on the first active layer ACT1 of the first thin film transistor ST1. The lower metal layer BML may be formed as a single layer or multiple layers made of any one of molybdenum (Mo), aluminum (Al), chromium (Cr), gold (Au), titanium (Ti), nickel (Ni), neodymium (Nd), and copper (Cu), or an alloy thereof. In another example, the lower metal layer BML may be omitted.

The first active layer ACT1 of the first thin film transistor ST1 may be disposed on the second buffer film BF2. The first active layer ACT1 of the first thin film transistor ST1 may include polycrystalline silicon, single crystal silicon, low-temperature polycrystalline silicon, amorphous silicon, or an oxide semiconductor. The first active layer ACT1 of the first thin film transistor ST1 exposed and not covered by the first gate insulating film GI1 may be doped with impurities or ions to have conductivity. Therefore, a first source electrode 51 and a first drain electrode D1 of the first active layer ACT1 of the first thin film transistor ST1 may be formed.

The first gate insulating film GI1 may be disposed on the first active layer ACT1 of the first thin film transistor ST1. It is illustrated in FIG. 5 that the first gate insulating film GI1 is disposed between the first gate electrode G1 and the first active layer ACT1 of the first thin film transistor ST1, but embodiments are not limited thereto. The first gate insulating film GI1 may also be disposed between the first interlayer insulating film 141 and the first active layer ACT1 and between the first interlayer insulating film 141 and the second buffer film BF2. The first gate insulating film GI1 may be formed as an inorganic layer, for example, a silicon nitride layer, a silicon oxynitride layer, a silicon oxide layer, a titanium oxide layer, or an aluminum oxide layer.

The first gate electrode G1 of the first thin film transistor ST1 may be disposed on the first gate insulating film GI1. The first gate electrode G1 of the first thin film transistor ST1 may overlap the first active layer ACT1 in the third direction DR3. The first gate electrode G1 of the first thin film transistor ST1 may be formed as a single layer or multiple layers made of any one of molybdenum (Mo), aluminum (Al), chromium (Cr), gold (Au), titanium (Ti), nickel (Ni), neodymium (Nd), and copper (Cu), or an alloy thereof.

The first interlayer insulating film 141 may be disposed on the first gate electrode G1 of the thin film transistor ST1. The first interlayer insulating film 141 may be formed as an inorganic film, for example, a silicon nitride layer, a silicon oxynitride layer, a silicon oxide layer, a titanium oxide layer, or an aluminum oxide layer. The first interlayer insulating film 141 may include inorganic films.

The first capacitor electrode CAE1 may be disposed on the first interlayer insulating film 141. The first capacitor electrode CAE1 may overlap the first gate electrode G1 of the first thin film transistor ST1 in the third direction (e.g., Z-axis direction). Since the first interlayer insulating film 141 has a certain dielectric constant, a capacitor may be formed by the first capacitor electrode CAE1, the first gate electrode G1, and the first interlayer insulating film 141 disposed between the first capacitor electrode CAE1 and the first gate electrode G1. The first capacitor electrode CAE1 may be formed as a single layer or multiple layers made of any one of molybdenum (Mo), aluminum (Al), chromium (Cr), gold (Au), titanium (Ti), nickel (Ni), neodymium (Nd), and copper (Cu), or an alloy thereof.

The second interlayer insulating film 142 may be disposed on the first capacitor electrode CAE1. The second interlayer insulating film 142 may be formed as an inorganic film, for example, a silicon nitride layer, a silicon oxynitride layer, a silicon oxide layer, a titanium oxide layer, or an aluminum oxide layer. The second interlayer insulating film 142 may include inorganic films.

The first anode connection electrode ANDE1 may be disposed on the second interlayer insulating film 142. The first anode connection electrode ANDE1 may be connected (e.g., electrically connected) to the first drain electrode D1 of the first thin film transistor ST1 through a first anode contact hole ANCT1 penetrating through the first interlayer insulating film 141 and the second interlayer insulating film 142 to expose the first drain electrode D1 of the first thin film transistor ST1. The first anode connection electrode ANDE1 may be formed as a single layer or multiple layers made of any one of molybdenum (Mo), aluminum (Al), chromium (Cr), gold (Au), titanium (Ti), nickel (Ni), neodymium (Nd), and copper (Cu), or an alloy thereof.

The first organic film 160 for planarization may be disposed on the first anode connection electrode ANDE1. The first organic film 160 may be formed as an organic film made of an acryl resin, an epoxy resin, a phenolic resin, a polyamide resin, a polyimide resin, or the like.

The second anode connection electrode ANDE2 may be disposed on the first organic film 160. The second anode connection electrode ANDE2 may be connected (e.g., electrically connected) to the first anode connection electrode ANDE1 through a second anode contact hole ANCT2 penetrating through the first organic film 160 to expose the first anode connection electrode ANDE1. The second anode connection electrode ANDE2 may be formed as a single layer or multiple layers made of any one of molybdenum (Mo), aluminum (Al), chromium (Cr), gold (Au), titanium (Ti), nickel (Ni), neodymium (Nd), and copper (Cu), or an alloy thereof.

The second organic film 180 may be disposed on the second anode connection electrode ANDE2. The second organic film 180 may be formed as an organic film made of an acryl resin, an epoxy resin, a phenolic resin, a polyamide resin, a polyimide resin, or the like.

It is illustrated in FIG. 5 that the first thin film transistor ST1 is formed in a top gate type in which the first gate electrode G1 is positioned above the first active layer ACT1, but embodiments are not limited thereto. The first thin film transistor ST1 may be formed in a bottom gate type in which the gate electrode G1 is positioned below the first active layer ACT1 or a double gate type in which the gate electrode G1 is positioned both above and below the first active layer ACT1.

Light emitting elements 170 and a bank 190 may be disposed on the second organic film 180. For example, the light emitting elements 170 and the bank 190 may form a light emitting element layer. Each of the light emitting elements 170 may include a first light emitting electrode 171, a light emitting layer 172, and a second light emitting electrode 173.

The first light emitting electrode 171 may be formed on the second organic film 180. The first light emitting electrode 171 may be connected (e.g., electrically connected) to the second anode connection electrode ANDE2 through a third anode contact hole ANCT3 penetrating through the second organic film 180 to expose the second anode connection electrode ANDE2.

The first light emitting electrode 171 may be formed on the second organic film 180. The first light emitting electrode 171 may be connected (e.g., electrically connected) to the second anode connection electrode ANDE2 through a third anode contact hole ANCT3 penetrating through the second organic film 180 to expose the second anode connection electrode ANDE2.

In a top emission structure in which light is emitted toward the second light emitting electrode 173 based on the light emitting layer 172, the first light emitting electrode 171 may be formed of a metal material having high reflectance, such as a stacked structure (Ti/Al/Ti) of aluminum and titanium, a stacked structure (ITO/Al/ITO) of aluminum and indium tin oxide (ITO), an APC alloy, and a stacked structure (ITO/APC/ITO) of an APC alloy and ITO. The APC alloy may be an alloy of silver (Ag), palladium (Pd), and copper (Cu).

The bank 190 may be formed to partition (or divide) the first light emitting electrode 171 on the second organic film 180 to define a light emitting area EA. The bank 190 may be formed to cover an edge portion of the first light emitting electrode 171. The bank 190 may be formed as an organic film such as an acrylic resin, an epoxy resin, a phenolic resin, a polyamide resin, or a polyimide resin.

The light emitting area EA refers to an area in which the first light emitting electrode 171, the light emitting layer 172, and the second light emitting electrode 173 are sequentially stacked and holes from the first light emitting electrode 171 and electrons from the second light emitting electrode 173 are combined with each other in the light emitting layer 172 to emit light.

The light emitting layer 172 may be formed on the first light emitting electrode 171 and the bank 190. The light emitting layer 172 may include an organic material to emit light of a certain color. For example, the light emitting layer 172 may include a hole transporting layer, an organic material layer, and an electron transporting layer.

The second light emitting electrode 173 may be disposed on the light emitting layer 172. The second light emitting electrode 173 may be formed to cover the light emitting layer 172. The second light emitting electrode 173 may be a common layer commonly formed in all the light emitting areas EA. For example, a capping layer may be formed on the second light emitting electrode 173.

In the top emission structure, the second light emitting electrode 173 may be formed of transparent conductive oxide (TCO) such as indium tin oxide (ITO) or indium zinc oxide (IZO) capable of transmitting light or a semi-transmissive conductive material such as magnesium (Mg), silver (Ag), or an alloy of magnesium (Mg) and silver (Ag). In case that the second light emitting electrode 173 is formed of the semi-transmissive conductive material, light emission efficiency may be increased by a micro cavity.

The encapsulation layer TFE may be disposed on the second light emitting electrode 173. The encapsulation layer TFE may include at least one inorganic film to prevent oxygen or moisture from permeating into the light emitting element layer. For example, the encapsulation layer TFE may include at least one organic film to protect the light emitting element layer from foreign materials such as dust. For example, the encapsulation layer TFE may include a first inorganic film TFE1, an organic film TFE2, and a second inorganic film TFE3.

The first inorganic film TFE1 may be disposed on the second light emitting electrode 173, the organic film TFE2 may be disposed on the first inorganic film TFE1, and the second inorganic film TFE3 may be disposed on the organic film TFE2. The first inorganic film TFE1 and the second inorganic film TFE3 may be formed as a multilayer film in which one or more inorganic films of a silicon nitride layer, a silicon oxynitride layer, a silicon oxide layer, a titanium oxide layer, and an aluminum oxide layer are alternately stacked. The organic film TFE2 may be a monomer.

The touch sensing layer TSU may be disposed on the encapsulation layer TFE. The touch sensing layer TSU may include touch electrodes for sensing a user's touch in a capacitance method, and touch lines connecting the touch electrodes and the touch driving unit. For example, the touch sensing layer TSU may sense the user's touch in a mutual capacitance method or a self-capacitance method.

In another example, the touch sensing layer TSU may be disposed on a separate substrate disposed on the display layer DU. For example, the substrate supporting the touch sensing layer TSU may be a base member that encapsulates the display layer DU.

The touch electrodes of the touch sensing layer TSU may be disposed in a touch sensor area overlapping the display area. The touch lines of the touch sensing layer TSU may be disposed in a touch peripheral area overlapping the non-display area.

The touch sensing layer TSU may include a first touch insulating layer SILL a first touch electrode REL, a second touch insulating layer SIL2, a second touch electrode TEL, and a third touch insulating layer SIL3.

The first touch insulating layer SIL1 may be disposed on the encapsulation layer TFE. The first touch insulating layer SIL1 may have insulation and optical functions. The first touch insulating layer SIL1 may include at least one inorganic film. For example, the second touch insulating layer SIL2 may be an inorganic film including at least one of a silicon nitride layer, a silicon oxy nitride layer, a silicon oxide layer, a titanium oxide layer, and an aluminum oxide layer. In another example, the first touch insulating layer SIL1 may be omitted.

The first touch electrode REL may be disposed on the first touch insulating layer SIL1. The first touch electrode REL may not overlap the light emitting element 170. The first touch electrode REL may be formed as a single layer made of molybdenum (Mo), titanium (Ti), copper (Cu), aluminum (Al), or indium tin oxide (ITO), or be formed as a stacked structure (Ti/Al/Ti) of aluminum and titanium, a stacked structure (ITO/Al/ITO) of aluminum and ITO, an APC alloy, and a stacked structure (ITO/APC/ITO) of an APC alloy and ITO.

In an embodiment, the first touch electrode REL may overlap the non-opening area LSA in the third direction DR3 as illustrated in FIG. 5. The first touch electrode REL may not overlap the opening area OA in the third direction DR3. For example, the first touch electrode REL may overlap the first light transmitting portion LTA1 and the light blocking film LS in the third direction DR3, and may not overlap the second light transmitting portions LTA2.

The second touch insulating layer SIL2 may cover the first touch electrode REL and the first touch insulating layer SIL1. The second touch insulating layer SIL2 may have insulation and optical functions. For example, the second touch insulating layer SIL2 may be made of the material illustrated in the first touch insulating layer SILL The second touch electrode TEL may be disposed on the second touch insulating layer SIL2. The second touch electrode TEL may not overlap the light emitting element 170. The second touch electrode TEL may be formed as a single layer made of molybdenum (Mo), titanium (Ti), copper (Cu), aluminum (Al), or indium tin oxide (ITO), or be formed as a stacked structure (Ti/Al/Ti) of aluminum and titanium, a stacked structure (ITO/Al/ITO) of aluminum and ITO, an APC alloy, and a stacked structure (ITO/APC/ITO) of an APC alloy and ITO.

In an embodiment, the second touch electrode TEL may overlap the non-opening area LSA in the third direction DR3 as illustrated in FIG. 5. The second touch electrode TEL may not overlap the opening area OA in the third direction DR3. For example, the second touch electrode TEL may overlap the first light transmitting portion LTA1 and the light blocking film LS in the third direction DR3, and may not overlap the second light transmitting portions LTA2.

The third touch insulating layer SIL3 may cover the second touch electrode TEL and the second touch insulating layer SIL2. The third touch insulating layer SIL3 may have insulation and optical functions. The third touch insulating layer SIL3 may be made of the materials illustrated in the second touch insulating layer SIL2.

The touch sensing layer TSU may further include a planarization layer PAS for planarization. The planarization layer PAS may be formed of an organic film such as an acrylic resin, an epoxy resin, a phenolic resin, a polyamide resin, or a polyimide resin.

Figure 6:
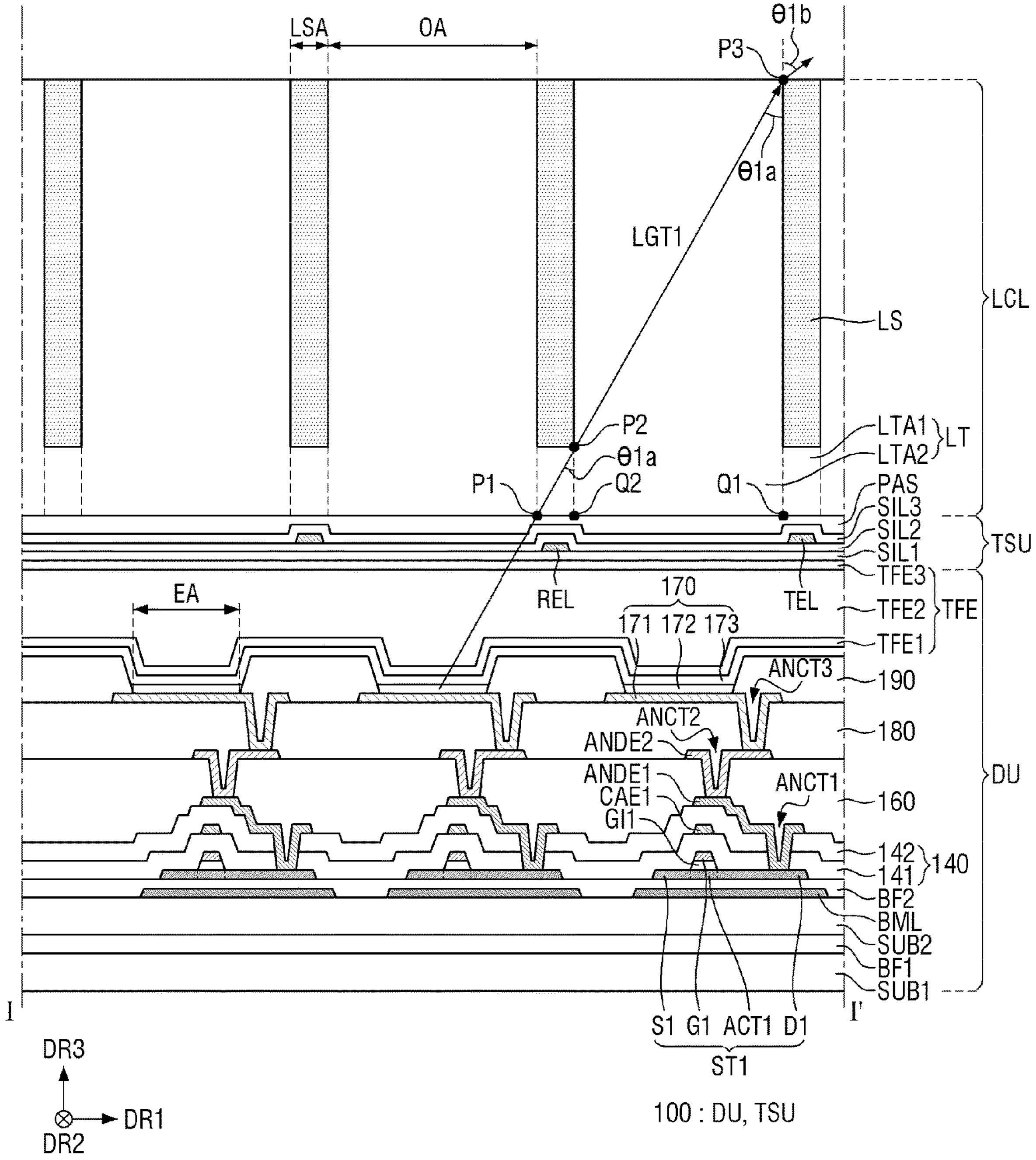
FIG. 6 is a schematic cross-sectional view of a display panel and a light control layer taken along line I-I' of FIG. 1A.
Figure 7:
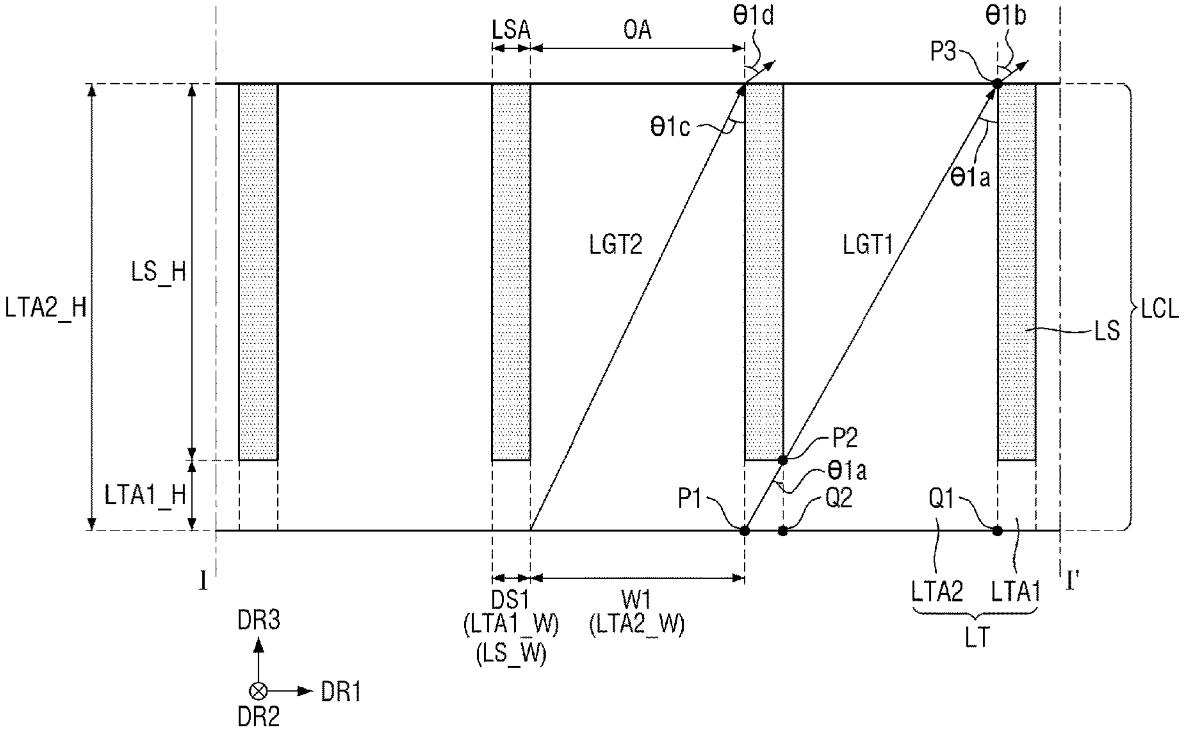
FIG. 7 is a schematic cross-sectional view of a light control layer according to an embodiment.

FIG. 6 is a schematic cross-sectional view of a display panel and a light control layer taken along line I-I' of FIG. 1A. FIG. 7 is a schematic cross-sectional view of a light control layer according to an embodiment.

Referring to FIGS. 6 and 7 together with FIGS. 1A and 1B, the light control layer LCL may be disposed on the display panel 100. The light control layer LCL may control a viewing angle of light emitting from the display panel 100. For example, in case that light emitted from the display panel 100 travels (or transmits) at a certain angle or less with respect to the third direction DR3, the light may be emitted to the outside. In case that the light emitted from the display panel 100 travels (or transmits) beyond a certain angle with respect to the third direction DR3, the light may be absorbed by the light blocking film LS and not emitted to the outside.

The light control layer LCL may include a light transmitting film LT and a light blocking film LS.

The light blocking film LS may be spaced apart from the display panel 100 and disposed on the first light transmitting portion LTA1 of the light transmitting film LT. A lower surface of the light blocking film LS may be in contact with (e.g., in direct contact with) an upper surface of the first light transmitting portion LTA1. In an embodiment, an area of the lower surface of the light blocking film LS may be the same as an area of the upper surface of the first light transmitting portion LTA1, but embodiments are not limited thereto.

The light blocking film LS may be disposed in the non-opening area LSA. The light blocking film LS may include openings disposed in the opening area OA. The light blocking film LS may surround at least a portion of the second light transmitting portion LTA2 disposed in the opening of the opening area OA.

The light blocking film LS may absorb or block the light emitted from the display panel 100. The light blocking film LS may include a light blocking organic material. For example, the light blocking film LS may include an organic material including an organic black pigment such as carbon black, as a photosensitive resin capable of absorbing or blocking light.

In some embodiments, the light blocking film LS may overlap touch electrodes REL and TEL in the third direction DR3. As the light blocking film LS and the touch electrodes REL and TEL are disposed so as not to overlap the light emitting area EA, luminance and display quality of the display device 10 may be improved.

The light transmitting film LT may be disposed on the display panel 100. The light transmitting film LT may include a first light transmitting portion LTA1 and second light transmitting portions LTA2. The light transmitting film LT may be disposed in the non-opening area LSA and the opening area OA on a lower side of the light blocking film LS. For example, the first light transmitting portion LTA1 of the light transmitting film LT may be disposed in the non-opening area LSA on the lower side of the light blocking film LS, and the second light transmitting portions LTA2 of the light transmitting film LT may be disposed in the opening area OA.

The light transmitting film LT may transmit the light emitted from the display panel 100. The light transmitting film LT may include a transparent organic material. For example, the light transmitting film LT may be an organic film made of an acryl resin, an epoxy resin, a phenolic resin, a polyamide resin, a polyimide resin, or the like. In an, the light transmitting film LT may be formed as a silicon oxy nitride layer or a silicon oxide layer. The light transmitting film LT may have a refractive index in a range of about 1.1 to about 1.6.

The first light transmitting portion LTA1 may be disposed between the display panel 100 and the light blocking film LS. The upper surface of the first light transmitting portion LTA1 may be in contact with (e.g., in direct contact with) the lower surface of the light blocking film LS. In an embodiment, as an area of the upper surface of the first light transmitting portion LTA1 may be the same as an area of the lower surface of the light blocking film LS, but embodiments are not limited thereto.

The first light transmitting portion LTA1 may be disposed in the non-opening area LSA. The first light transmitting portion LTA1 may include openings disposed in the opening area OA. The first light transmitting portion LTA1 may surround at least a portion of the second light transmitting portions LTA2 disposed in the opening.

A thickness LS_H of the light blocking film LS may be greater than a thickness LTA1_H of the first light transmitting portion LTA1. For example, the thickness LS_H of the light blocking film LS may be about 10 μm to about 25 μm, and the thickness LTA1_H of the first light transmitting portion LTA1 may be about 2 μm to about 8 μm.

The second light transmitting portions LTA2 may be disposed on the display panel 100. The second light transmitting portions LTA2 may be in contact with (e.g., in direct contact with) the display panel 100. The second light transmitting portions LTA2 may be disposed inside the opening formed in the light blocking film LS and inside the opening formed in the first light transmitting portion LTA1. Side surfaces of the second light transmitting portions LTA2 may be in contact with an inner sidewall of the opening formed in the light blocking film LS and an inner sidewall of the opening formed in the first light transmitting portion LTA1. The second light transmitting portions LTA2 may have a polygonal column shape such as a cylindrical column, an elliptical column, or a quadrangular column.

The second light transmitting portions LTA2 may be disposed to be spaced apart from each other. In some embodiments, the second light transmitting portions LTA2 may be disposed along the first direction DR1 and the second direction DR2 at regular intervals, e.g., along row and column directions. For example, a distance between any two second light transmitting portions LTA2 adjacent to each other along the first direction DR1 and the second direction DR2 among the second light transmitting portions LTA2 may be the same, but embodiments are not limited thereto.

A first distance DS1, which is a distance between the second light transmitting portions LTA2 in the first and second directions DR1 and DR2, may be substantially equal to a width LS_W of the light blocking film LS disposed between the second light transmitting portions LTA2 and a width LTA1_W of the first light transmitting portion LTA1 disposed between the second light transmitting portion LTA2. In an embodiment, the first distance DS1 may be about 1 μm to about 4 μm.

A first width W1 that is a width LTA2_W of the second light transmitting portions LTA2 may be greater than the first distance DS1. In an embodiment, the first width W1 may be about 6 μm to about 9 μm.

The thickness LTA2_H of the second light transmitting portions LTA2 may be substantially equal to the sum of the thickness LS_H of the light blocking film LS and the thickness LTA1_H of the first light transmitting portion LTA1. In an embodiment, the thickness LTA2_H of the second light transmitting portions LTA2 may be about 10 μm to about 35 μm.

In some embodiments, a ratio of the first distance DS1 to the first width W1 may be substantially equal to a ratio of the thickness LTA1_H of the first light transmitting portion LTA1 to the thickness LS_H of the light blocking film LS. For example, the ratio of the first distance DS1 to the first width W1 and the ratio of the thickness LTA1_H of the first light transmitting portion LTA1 to the thickness LS_H of the light blocking film LS may be about 1:9 to about 2:3. In case that the ratio is greater than about 1:9, an increase in the thickness of the display device 10 due to an increase in the thickness of the light control layer LCL may be prevented. For example, in methods S10 and S20 (see FIGS. 16 and 22) for manufacturing a display device to be described below, an opening of the light blocking film LS and an opening of the first light transmitting portion LTA1 in which the second light transmitting portion LTA2 is disposed may be formed by a dry etching process. For example, in case that the ratio is designed to be greater than about 1:9, it is possible to prevent a bowing profile from being formed and achieve a vertical profile. In case that the ratio is smaller than 2:3, the required viewing angle may be achieved.

As illustrated in FIGS. 6 and 7, first light LGT1 emitted from the display panel 100 may be incident toward an interface where the light control layer LCL and the outside (e.g., air) meet, e.g., the upper surface of the light control layer LCL at a first incident angle θ1*a*. The first light LGT1 may be refracted at the interface at a first refraction angle θ1*b* and emitted.

As illustrated in FIG. 7, second light LGT2 that is different from the first light LGT1 and emitted from the display panel 100 may be incident toward an interface where the light control layer LCL and the outside (e.g., air) meet, e.g., the upper surface of the light control layer LCL at a second incident angle θ1*c*. The second light LGT2 may be refracted at the interface at a second refraction angle θ1*d* and emitted.

The refraction angle θ1*b* of the first light LGT1 may be greater than the refraction angle θ1*d* of the second light LGT2. The refraction angle θ1*b* of the first light LGT1 may be a maximum viewing angle of the display device 10.

The first light LGT1 may travel (or transmit) in a straight line and pass through a first point P1, a second point P2, and a third point P3. The first point P1, the second point P2, and the third point P3 may be positioned on a straight line.

On the cross sections illustrated in FIGS. 6 and 7, the first point P1 may be a point where an interface where a side surface of the second light transmitting portion LTA2 and a side surface of the first light transmitting portion LTA1 are in contact with each other meets the lower surface of the second light transmitting portion LTA2. The second point P2 may be a point where an interface where the lower surface of the light blocking film LS and the upper surface of the first light transmitting portion LTA1 are in contact with each other meets another side surface of the second light transmitting portion LTA2 adjacent (e.g., directly adjacent) to the second light transmitting portion LTA2 including the first point P1. The third point P3 may be a point where an interface where a side surface of the light blocking film LS and a side surface of the second light transmitting portion LTA2 including the second point P2 meets the upper surface of the second light transmitting portion LTA2 including the second point P2.

A first triangle may be formed by the first point P1, the third point P3, and a first vertex Q1. A second triangle may be formed by the first point P1, the second point P2, and a second vertex Q2. The first vertex Q1 may be a point where an interface where a side surface of the second light transmitting portion LTA2 including the second point P2 is in contact with the side surface of the first light transmitting portion LTA1 meets the lower surface of the second light transmitting portion LTA2 including the second point P2. The second vertex Q2 may be a point where an interface where another side surface of the second light transmitting portion LTA2 including the second point P2 is in contact with the first light transmitting portion LTA1 meets the lower surface of the second light transmitting portion LTA2 including the second point P2.

According to the rule of similarity ratio between the first triangle and the second triangle, a ratio of the first distance DS1 to the first width W1 may be substantially equal to a ratio of the thickness LTA1_H of the first light transmitting portion LTA1 to the thickness LS_H of the light blocking film LS.

In the methods S10 and S20 (see FIGS. 16 and 22) for manufacturing a display device to be described below, an opening of the light blocking film LS and an opening of the first light transmitting portion LTA1 in which the second light transmitting portion LTA2 is disposed may be formed by a dry etching process. In case that the thickness LS_H of the light blocking film LS and the thickness LTA1_H of the first light transmitting portion LTA1 are designed to be large, not only does it take a long time to etch, but a profile of the opening may not be formed vertically during an etching process, but may be formed as a bowing profile. For example, a problem in that optical characteristics are different for each position of the light control layer LCL may occur. In case that the thickness LS_H of the light blocking film LS and the thickness LTA1_H of the first light transmitting portion LTA1 are designed to be small, the required viewing angle may not be achieved.

In case that the first width W1, which is the width of the opening of the light blocking film LS and the width of the opening of the first light transmitting portion LTA1, e.g., the width LTA2_W of the second light transmitting portion LTA2 is designed to be narrow, the profile of the opening may not be formed vertically during the etching process but may be formed as a bowing profile. For example, similarly, a problem in that optical characteristics are different for each position of the light control layer LCL may occur. For example, a problem in that transmittance and luminance may decrease due to the narrowing of the width of the opening area OA may occur. In case that the first width W1, which is the width of the opening of the light blocking film LS and the width of the opening of the first light transmitting portion LTA1, e.g., the width LTA2_W of the second light transmitting portion LTA2 is designed to be wide, the required viewing angle may not be achieved.

In the display device 10, by making the ratio of the thickness LTA1_H of the first light transmitting portion LTA1 to the thickness LS_H of the light blocking film LS substantially equal to the ratio of the first distance DS1 to the first width W1, the viewing angle may be minimized and the optical characteristics of the light control layer LCL may be made even.

For example, according to the display device 10, as the light blocking film LS is not disposed in the opening of the light transmitting film, but the second light transmitting portion LTA2 is disposed in the opening of the previously formed light blocking film LS, a process of removing the light blocking film LS, which is formed to be higher than the light transmitting film LT, may not be performed in the methods S10 and S20 (see FIGS. 16 and 22) for manufacturing a display device to be described below. Accordingly, process efficiency may be improved, and damage to the light transmitting film LT occurring in the process of removing the light blocking film LS may be prevented.

Hereinafter, other embodiments of the display device will be described. In the following embodiments, the same components as those of the above-described embodiment will be denoted by the same reference numerals, and a redundant description thereof will be omitted or simplified and differences will be described for descriptive convenience.

Figure 8:
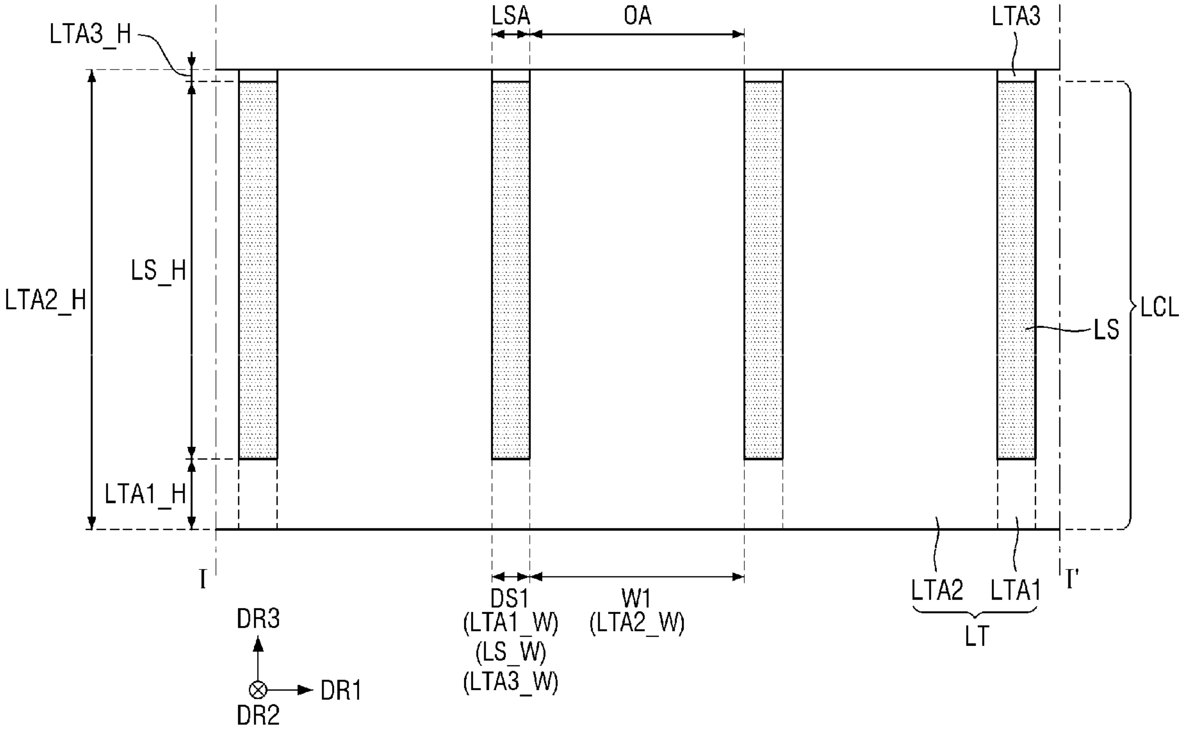
FIG. 8 is a schematic cross-sectional view of a light control layer according to an embodiment.

FIG. 8 is a schematic cross-sectional view of a light control layer according to an embodiment.

Referring to FIG. 8, the display device 10 may be different from the display device 10 according to the embodiment described with reference to FIG. 7 and the like in that the light transmitting film LT further includes a third light transmitting portion LTA3.

For example, the light transmitting film LT of the display device 10 according to an embodiment may further include a third light transmitting portion LTA3.

The third light transmitting portion LTA3 may be disposed on the light blocking film LS. The third light transmitting portion LTA3 may overlap the light blocking film LS in the third direction DR3. A lower surface of the third light transmitting portion LTA3 may be in contact with (e.g., in direct contact with) the upper surface of the light blocking film LS. In an embodiment, as an area of the lower surface of the third light transmitting portion LTA3 may be the same as an area of the upper surface of the light blocking film LS, but embodiments are not limited thereto.

The third light transmitting portion LTA3 may be disposed in the non-opening area LSA. The third light transmitting portion LTA3 may include openings disposed in the opening area OA. The third light transmitting portion LTA3 may surround at least a portion of the second light transmitting portion LTA2 disposed in the opening area OA.

The third light transmitting portion LTA3 may transmit the light emitted from the display panel 100. The third light transmitting portion LTA3 may include a transparent organic material. The third light transmitting portion LTA3 may be formed of a material different from that of the first light transmitting portion LTA1 and the second light transmitting portion LTA2. The third light transmitting portion LTA3 may be an organic film or an inorganic film. For example, in case that the third light transmitting portion LTA3 is an organic film, the third light transmitting portion LTA3 may be made of a photoresist. In case that the third light transmitting portion LTA3 is an inorganic layer, the third light transmitting portion LTA3 may be made of transparent conductive oxide (TCO). For example, in case that the third light transmitting portion LTA3 is an inorganic film, the third light transmitting portion LTA3 may be made of indium tin oxide (ITO) or indium zinc oxide (IZO).

The third light transmitting portion LTA3 may have substantially the same refractive index as that of the first light transmitting portion LTA1 and the second light transmitting portion LTA2. For example, the third light transmitting portion LTA3 may have a refractive index in a range of about 1.1 to about 1.6. Accordingly, light passing through the third light transmitting portion LTA3 may not be refracted, and may be incident and emitted at the same angle as that of the second light transmitting portion LTA2.

A thickness LTA3_H of the third light transmitting portion LTA3 may be smaller than the thickness of the first light transmitting portion LTA1. For example, the thickness LTA3_H of the third light transmitting portion LTA3 may be several hundred nanometers to several micrometers. The thickness LTA2_H of the second light transmitting portion LTA2 may be substantially equal to the sum of the thickness LTA1_H of the first light transmitting portion LTA1, the thickness LS_H of the light blocking film LS, and the thickness LTA3_H of the third light transmitting portion LTA3.

A width LTA3_W of the third light transmitting portion LTA3 disposed between the second light transmitting portions LTA2 may be substantially equal to the first distance DS1 that is a distance between the second light transmitting portions LTA2, the width LTA1_W of the first light transmitting portion LTA1 disposed between the second light transmitting portions LTA2, and the width LS_W of the light blocking film LS disposed between the second light transmitting portions LTA2. In an embodiment, the width LTA3_W of the third light transmitting portion LTA3 disposed between the second light transmitting portions LTA2 may be about 1 μm to about 4 μm.

The display device 10 may have an opening of the light blocking film LS and an opening of the first light transmitting portion LTA1 in which the second light transmitting portion LTA2 which are formed by a dry etching process in methods S10 and S20 (see FIGS. 16 and 22) for manufacturing a display device to be described below. The third light transmitting portion LTA3 may be the same as a mask pattern layer MS used in the etching process. According to the display device 10, process efficiency may be increased by leaving the mask pattern layer MS (see FIGS. 18 and 24) used in the etching process without removing it.

Figure 9:
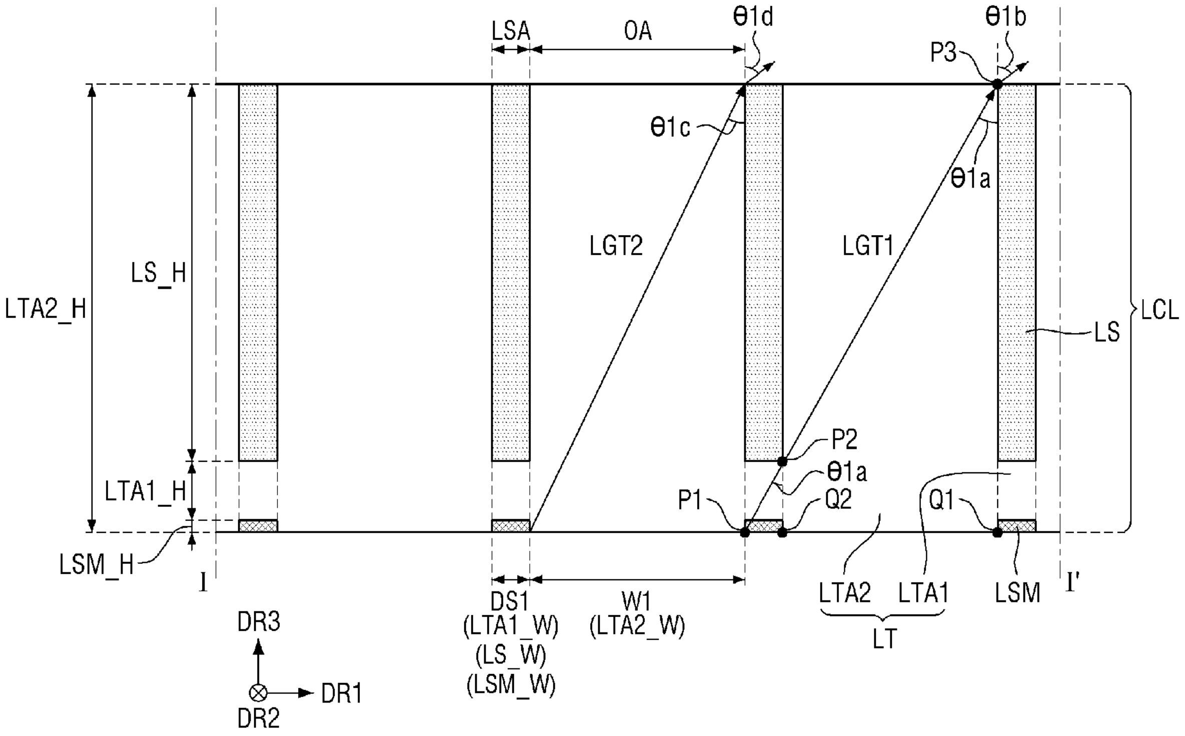
FIG. 9 is a schematic cross-sectional view of a light control layer according to an embodiment.

FIG. 9 is a schematic cross-sectional view of a light control layer according to an embodiment.

Referring to FIG. 9, the display device 10 may be different from the display device 10 according to the embodiment described with reference to FIG. 7 and the like in that the light control layer LCL may further include a light blocking pattern layer LSM.

For example, the light control layer LCL of the display device 10 according to an embodiment may further include a light blocking pattern layer LSM.

The light blocking pattern layer LSM may be disposed on the display panel 100. The light blocking pattern layer LSM may be in contact with (e.g., in direct contact with) the display panel 100. The light blocking pattern layer LSM may be positioned on an opposite side of the light blocking film LS with the first light transmitting portion LTA1 interposed between light blocking pattern layer LSM and the the light blocking film LS. An upper surface of the light blocking pattern layer LSM may be in contact with (e.g., in direct contact with) the lower surface of the first light transmitting portion LTA1. In an embodiment, an area of the upper surface of the light blocking pattern layer LSM may be the same as an area of the lower surface of the first light transmitting portion LTA1, but embodiments are not limited thereto.

The light blocking pattern layer LSM may be disposed in the non-opening area LSA. The light blocking pattern layer LSM may include openings disposed in the opening area OA. The light blocking pattern layer LSM may surround at least a portion of the second light transmitting portion LTA2 disposed in the opening of the opening area OA.

The light blocking pattern layer LSM may absorb or block the light emitted from the display panel 100. The light blocking pattern layer LSM may be a metal pattern layer and may include a light blocking metal material. For example, the light blocking pattern layer LSM may be a single layer or multiple layers including at least one of Mo, Al, Ti, W, Ag, Cu, and Au.

A thickness LSM_H of the light blocking pattern layer LSM may be smaller than the thickness of the first light transmitting portion LTA1. For example, the thickness LSM_H of the light blocking pattern layer LSM may be several hundred nanometers to several micrometers. The thickness LTA2_H of the second light transmitting portion LTA2 may be substantially equal to the sum of the thickness LTA1_H of the first light transmitting portion LTA1, the thickness LS_H of the light blocking film LS, and the thickness LSM_H of the light blocking pattern layer LSM.

A width LSM_W of the light blocking pattern layer LSM disposed between the second light transmitting portions LTA2 may be substantially equal to the first distance DS1 that is a distance between the second light transmitting portions LTA2, the width LTA1_W of the first light transmitting portion LTA1 disposed between the second light transmitting portions LTA2, and the width LS_W of the light blocking film LS disposed between the second light transmitting portions LTA2. In an embodiment, the width LSM_W of the light blocking pattern layer LSM disposed between the second light transmitting portions LTA2 may be about 1 μm to about 4 μm.

According to the display device 10, the viewing angle may be further reduced by additionally disposing the light blocking pattern layer LSM on a lower side of the first light transmitting portion LTA1.

Figure 10:
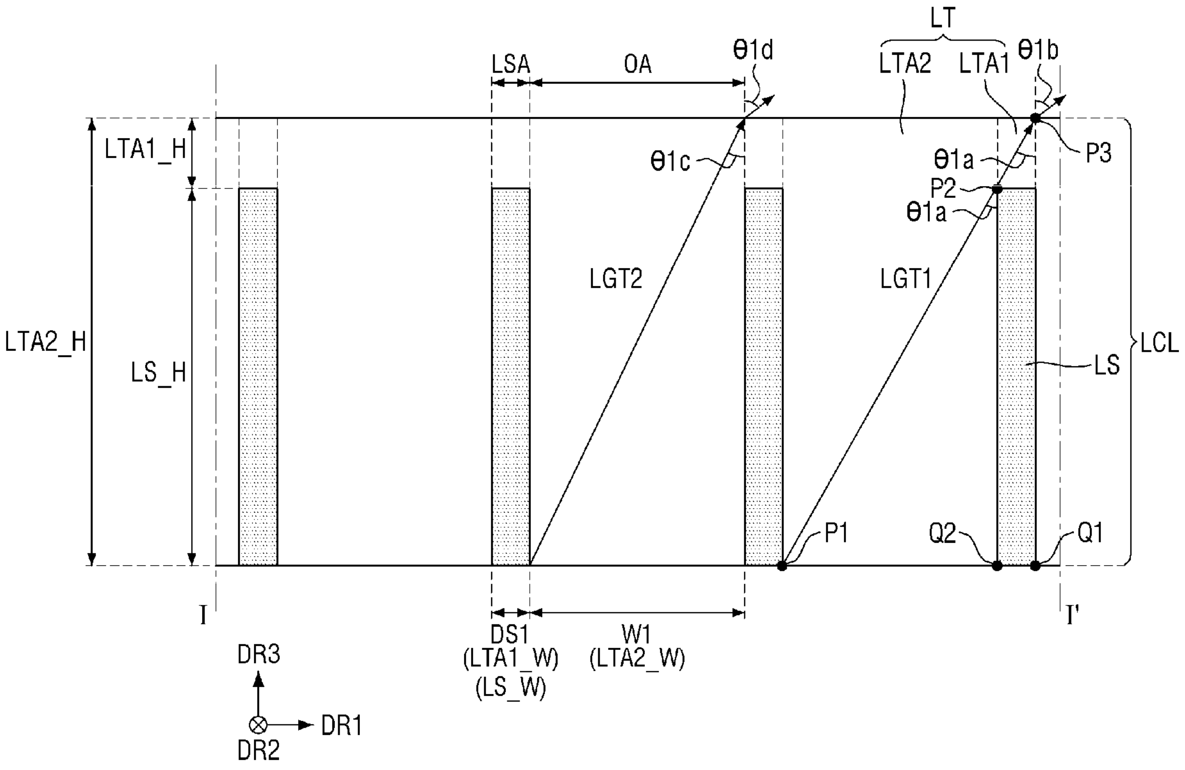
FIG. 10 is a schematic cross-sectional view of a light control layer according to an embodiment.

FIG. 10 is a schematic cross-sectional view of a light control layer according to an embodiment.

Referring to FIG. 10, the display device 10 may be different from the display device 10 according to the embodiment described with reference to FIG. 7 and the like in that the light blocking film LS is positioned lower than the first light transmitting portion LTA1.

For example, the light blocking film LS may be disposed on the display panel 100. The light blocking film LS may be disposed between the display panel 100 and the first light transmitting portion LTA1. The lower surface of the light blocking film LS may be in contact with (e.g., in direct contact with) the display panel 100. The upper surface of the light blocking film LS may be in contact with (e.g., in direct contact with) the lower surface of the first light transmitting portion LTA1. In an embodiment, an area of the upper surface of the light blocking film LS may be the same as an area of the lower surface of the first light transmitting portion LTA1, but embodiments are not limited thereto.

The first light transmitting portion LTA1 may be disposed on the light blocking film LS. The first light transmitting portion LTA1 may be positioned on an opposite side of the display panel 100 with the light blocking film LS interposed between the first light transmitting portion LTA1 and the opposite side of the display panel 100. The lower surface of the first light transmitting portion LTA1 may be in contact with (e.g., in direct contact with) the upper surface of the light blocking film LS. In an embodiment, an area of the lower surface of the first light transmitting portion LTA1 may be the same as an area of the upper surface of the light blocking film LS, but embodiments are not limited thereto.

The first light LGT1 may travel (or transmit) in a straight line and pass through a first point P1, a second point P2, and a third point P3. The first point P1, the second point P2, and the third point P3 may be positioned on a straight line.

On the cross section illustrated in FIG. 10, the first point P1 may be a point where an interface where another side surface of the second light transmitting portion LTA2 and a side surface of the light blocking film LS are in contact with each other meets the lower surface of the second light transmitting portion LTA2. The second point P2 may be a point where an interface where the upper surface of the light blocking film LS and the lower surface of the first light transmitting portion LTA1 are in contact with each other meets a side surface of the second light transmitting portion LTA2 including the first point P1. The third point P3 may be a point where an interface where the side surface of the first light transmitting portion LTA1 and another side surface of the second light transmitting portion LTA2 adjacent to the second light transmitting portion LTA2 including the second point P2 are in contact with each other meets the upper surface of the second light transmitting portion LTA2 adjacent to the second light transmitting portion LTA2 including the second point P2.

A first triangle may be formed by the first point P1, the third point P3, and a first vertex Q1. A second triangle may be formed by the first point P1, the second point P2, and a second vertex Q2. The first vertex Q1 may be a point where an interface where another side surface of the second light transmitting portion LTA2 including the second point P2 is in contact with the side surface of the light blocking film LS meets the lower surface of the second light transmitting portion LTA2 adjacent to the second light transmitting portion LTA2 including the second point P2. The second vertex Q2 may be a point where an interface where a side surface of the second light transmitting portion LTA2 including the second point P2 is in contact with the light blocking film LS meets the lower surface of the second light transmitting portion LTA2 including the second point P2.

According to the rule of similarity ratio between the first triangle and the second triangle, a ratio of the first distance DS1 to the first width W1 may be substantially equal to a ratio of the thickness LTA1_H of the first light transmitting portion LTA1 to the thickness LS_H of the light blocking film LS.

Figure 11:
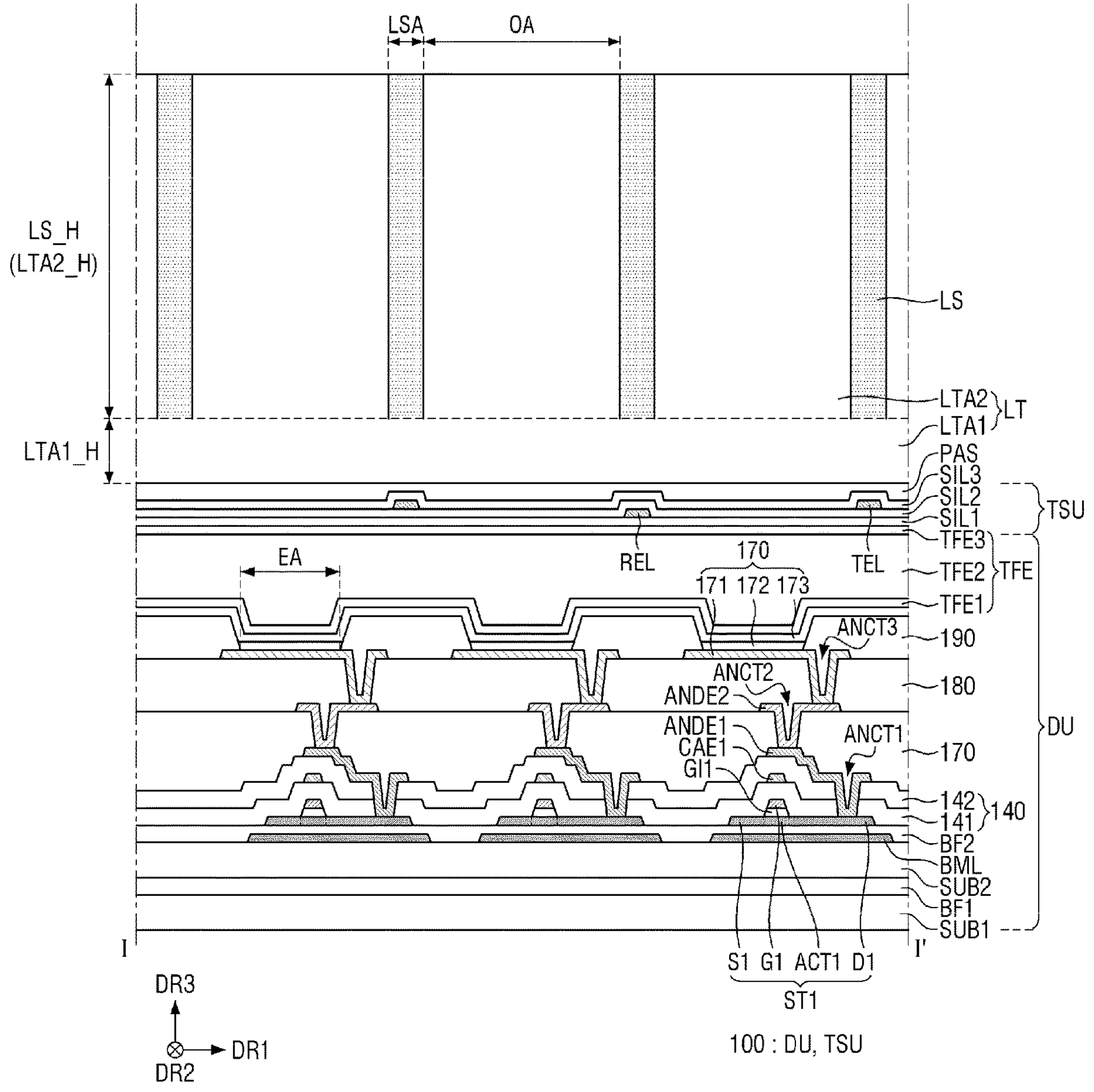
FIG. 11 is a schematic cross-sectional view of a display panel and a light control layer according to an embodiment.

FIG. 11 is a schematic cross-sectional view of a display panel and a light control layer according to an embodiment.

Referring to FIG. 11, the display device 10 is different from the display device 10 according to the embodiment described with reference to FIG. 6 and the like in that the first light transmitting portion LTA1 does not include the opening and the second light transmitting portion LTA2 is positioned on the first light transmitting portion LTA1.

For example, the first light transmitting portion LTA1 may not include the opening in the opening area OA. For example, the first light transmitting portion LTA1 may be disposed over the entirety of the non-opening area LSA and the opening area OA.

The upper surface of the first light transmitting portion LTA1 may be in contact with (e.g., in direct contact with) the lower surface of the light blocking film LS. However, unlike the embodiment described with reference to FIG. 6 and the like, since the first light transmitting portion LTA1 does not include the opening, an area of the upper surface of the first light transmitting portion LTA1 may be greater than an area of the lower surface of the light blocking film LS.

Since the first light transmitting portion LTA1 does not include the opening disposed in the opening area OA, the first light transmitting portion LTA1 may not surround the side surface of the second light transmitting portion LTA2, unlike the embodiment described with reference to FIG. 6 and the like. For example, the first light transmitting portion LTA1 may be in contact with (e.g., in direct contact with) only the lower surface of the second light transmitting portion LTA2.

The second light transmitting portions LTA2 may be disposed on the first light transmitting portion LTA1. The second light transmitting portions LTA2 may not be in direct contact with the display panel 100 and may be positioned on the opposite side of the display panel 100 with the first light transmitting portion LTA1 interposed between the second light transmitting portions LTA2 and the opposite side of the display panel 100.

The second light transmitting portions LTA2 may be disposed inside the openings formed in the light blocking film LS. Side surfaces of the second light transmitting portions LTA2 may be in contact with inner sidewalls of the openings formed in the light blocking film LS. The second light transmitting portions LTA2 may overlap the light blocking film LS and may not overlap the first light transmitting portion LTA1 in the first and second directions DR1 and DR2.

The thickness LTA2_H of the second light transmitting portions LTA2 may be the same as the thickness LS_H of the light blocking film LS. In an embodiment, the thickness LTA2_H of the second light transmitting portions LTA2 may be about 10 μm to about 25 μm.

The display device 10 may be manufactured by etching only the light blocking film LS without etching the first light transmitting portion LTA1 in an etching process of a method S20 (see FIG. 22) for manufacturing a display device to be described below. Therefore, since only the light blocking film LS is etched, process efficiency may be increased and an etching depth may be reduced to achieve a vertical profile.

Figure 12:
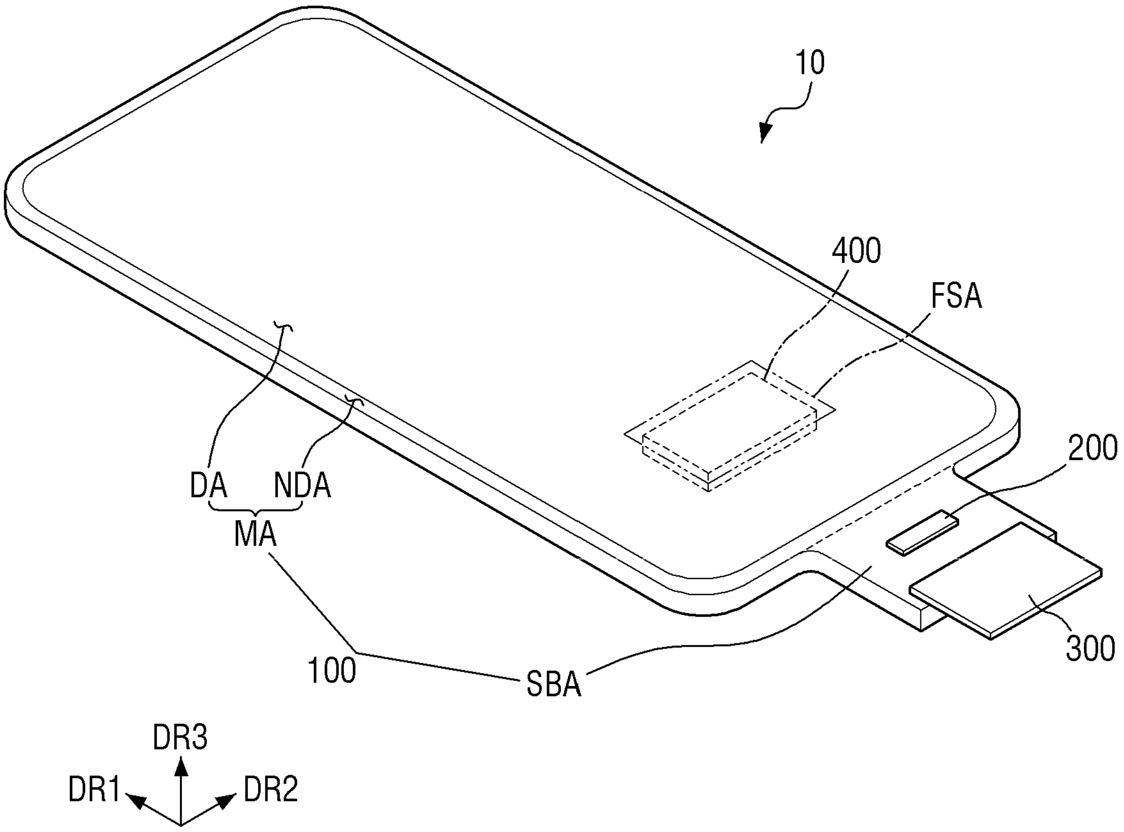
FIG. 12 is a schematic perspective view of a display device according to an embodiment.
Figure 13:
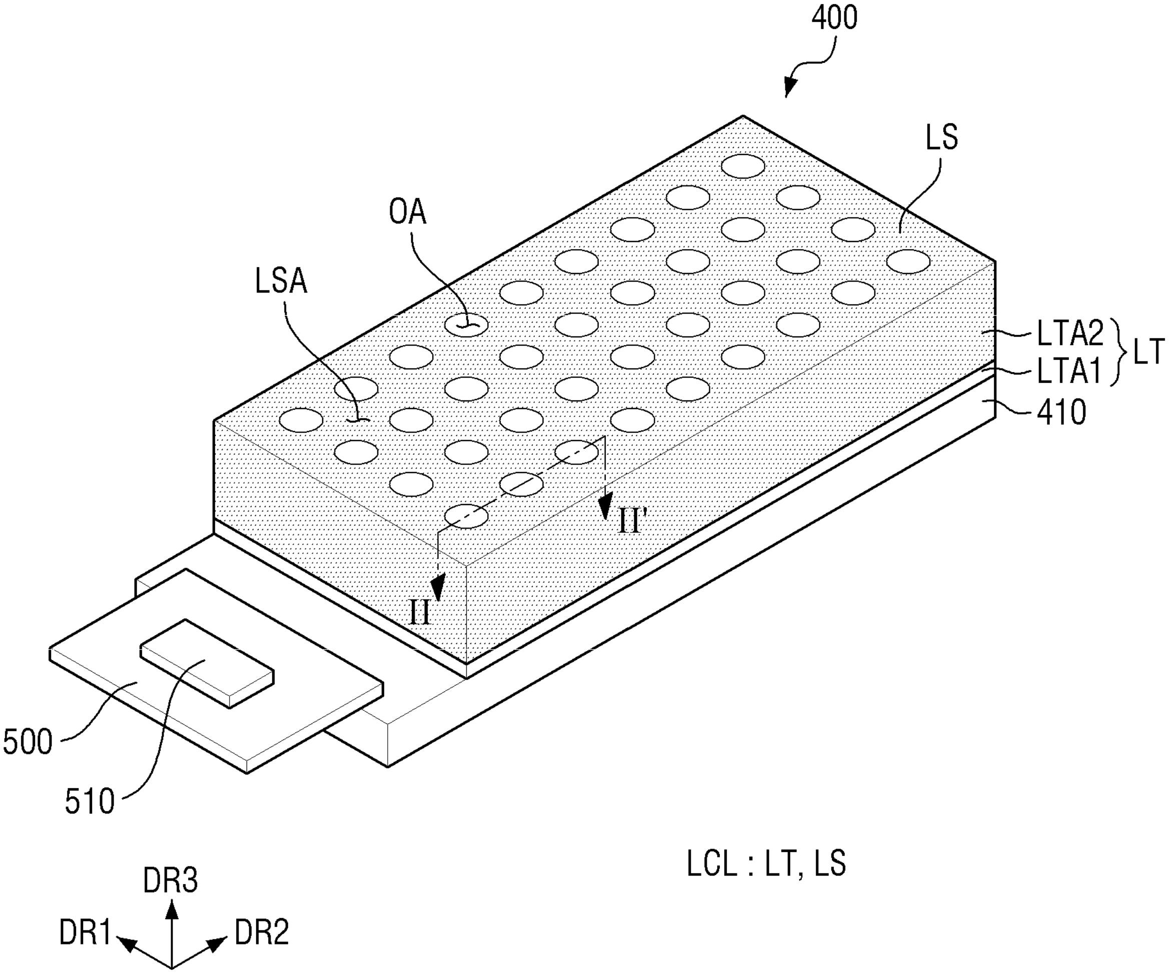
FIG. 13 is a schematic perspective view illustrating a fingerprint sensor of FIG. 12.
Figure 14:
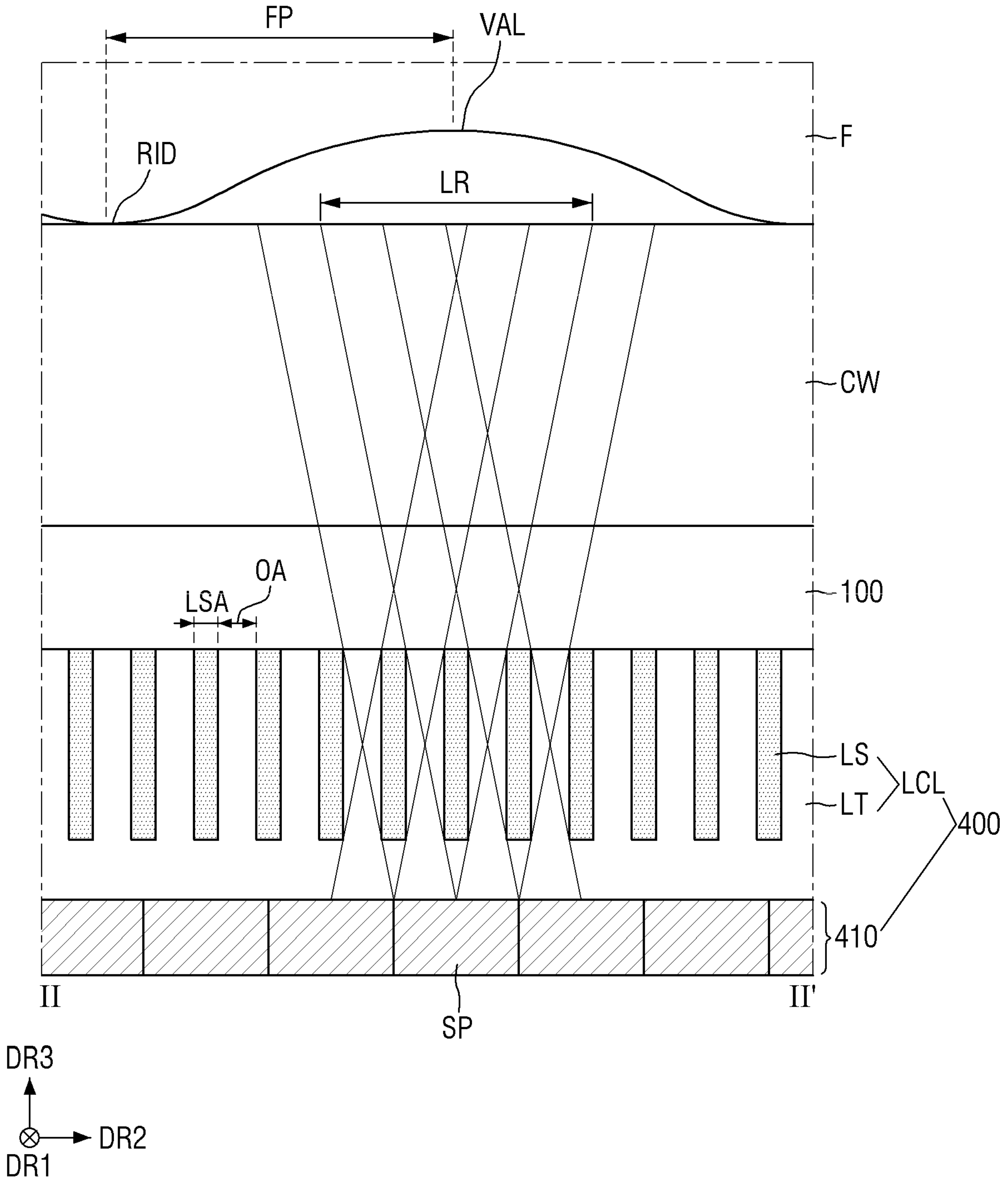
FIG. 14 is a schematic cross-sectional view taken along line II-IF of FIG. 13.
Figure 15:
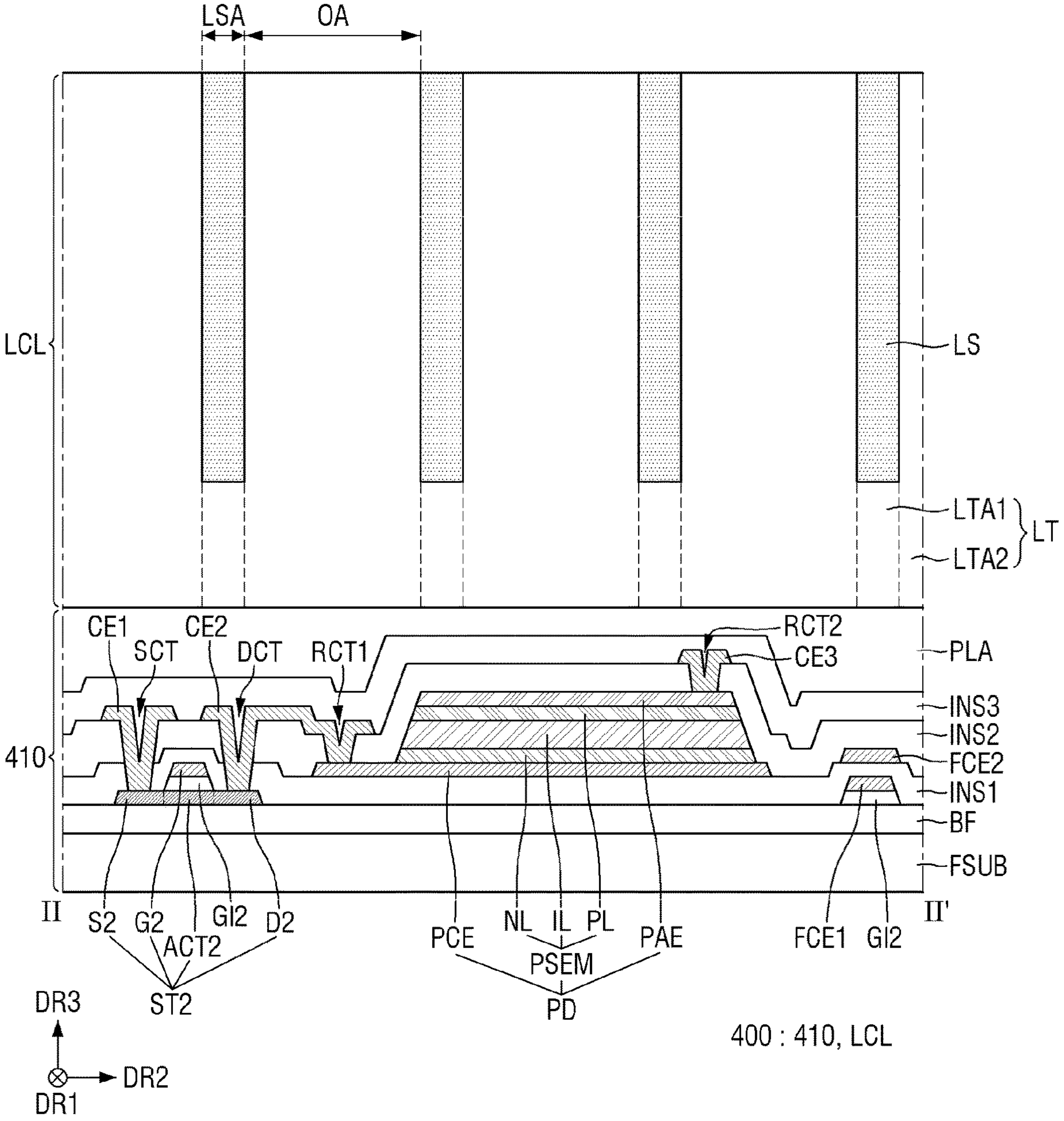
FIG. 15 is a schematic cross-sectional view illustrating the fingerprint sensor of FIG. 14.

FIG. 12 is a schematic perspective view of a display device according to an embodiment. FIG. 13 is a perspective view illustrating a fingerprint sensor of FIG. 12. FIG. 14 is a schematic cross-sectional view taken along line II-IF of FIG. 13. FIG. 15 is a schematic cross-sectional view illustrating the fingerprint sensor of FIG. 14.

Referring to FIGS. 12 to 15, the display device 10 is different from the display device 10 according to the embodiment described with reference to FIG. 1A and the like in that the display device 10 includes a fingerprint sensor 400 including a light control layer LCL.

For example, the display device 10 may include a display panel 100, a display driving circuit 200, a circuit board 300, and a fingerprint sensor 400.

The display panel 100 may include a main area MA and a sub-area SBA. The main area MA may include a display area DA displaying an image and a non-display area NDA which is a peripheral area of the display area DA. The display area DA may include display pixels displaying an image. The non-display area NDA may be defined as an area from the outside of the display area DA to an edge portion of the display panel 100.

The display area DA may include a fingerprint sensing area FSA. The fingerprint sensing area FSA refers to an area in which the fingerprint sensor 400 is disposed. As illustrated in FIG. 12, the fingerprint sensing area FSA may be a partial area of the display area DA, but embodiments are not limited thereto. The fingerprint sensing area FSA may be an entire area of the display area DA and may be substantially the same as the display area DA.

The sub-area SBA may protrude from a side of the main area MA in the first direction DR1. A length of the sub-area SBA in the first direction DR1 may be smaller than a length of the main area MA in the first direction DR1, and a length of the sub-area SBA in the second direction DR2 may be smaller than a length of the main area MA in the second direction DR2, but embodiments are not limited thereto.

It is illustrated in FIG. 12 that the sub-area SBA is unfolded, but the sub-area SBA may be bent, and the sub-area SBA may be disposed on a lower surface of the display panel 100. In case that the sub-area SBA is bent, the sub-area SBA may overlap the main area MA in a thickness direction of the substrate SUB, e.g., in the third direction DR3. The display driving circuit 200 may be disposed in the sub-area SBA.

Descriptions of the display driving circuit 200 and the circuit board 300 are the same as those of the embodiment described with reference to FIG. 1A and the like and will thus be omitted for descriptive convenience.

The fingerprint sensor may be disposed on the lower surface of the display panel 100. The fingerprint sensor 400 may be attached onto the lower surface of the display panel 100 by using a transparent adhesive member. For example, the transparent adhesive member may be a transparent adhesive film such as an optically clear adhesive (OCA) film or a transparent adhesive resin such as optically clear resin (OCR).

The fingerprint sensor 400 may include a fingerprint sensing layer 410 and a light control layer LCL.

The fingerprint sensing layer 410 may include sensor pixels arranged in the first and second directions DR1 and DR2. Each of the sensor pixels may include a light sensing element through which a sensing current flows according to incident light, at least one transistor connected (e.g., electrically connected) to the light sensing element, and at least one capacitor connected (e.g., electrically connected) to the light sensing element or the transistor. The light sensing element may generate the sensing current according to incident light. The light sensing element may be a photo diode or a photo transistor.

The light control layer LCL may be disposed on the fingerprint sensing layer 410. A description of the light control layer LCL is the same as that of the embodiment described with reference to FIG. 1A and the like and will thus be omitted for descriptive convenience.

A fingerprint circuit board 500 may be disposed on the fingerprint sensing layer 410 not covered by the light control layer LCL. The fingerprint circuit board 500 may be attached onto an upper surface of the fingerprint sensing layer 410 not covered by the light control layer LCL by using an anisotropic conductive film. As a result, the fingerprint circuit board 500 may be electrically connected to the sensor pixels of the fingerprint sensing layer 410. Therefore, each of the sensor pixels of the fingerprint sensing layer 410 may output a sensing voltage according to the sensing current of the light sensing element through the fingerprint circuit board 500. The fingerprint driving circuit 510 electrically connected to the fingerprint circuit board 500 may recognize a fingerprint pattern of a finger according to the sensing voltages of the sensor pixels.

The fingerprint driving circuit 510 may be disposed on the fingerprint circuit board 500 as illustrated in FIG. 13, but embodiments are not limited thereto. The fingerprint driving circuit 510 may be disposed on a separate circuit board electrically connected to the fingerprint circuit board 500. The fingerprint circuit board 500 may be a flexible printed circuit board, a printed circuit board, or a flexible film such as a chip-on film.

FIG. 14 illustrates that a user touches a user's finger F on the display device 10 for fingerprint recognition.

Referring to FIG. 14, the display device 10 may further include a cover window CW disposed on the upper surface of the display panel 100. The cover window CW may be disposed on an upper side of the display panel 100 so as to cover the upper surface of the display panel 100. The cover window CW may function to protect the upper surface of the display panel 100. The cover window CW may be attached onto the upper surface of the display panel 100 by using a transparent adhesive member.

The cover window CW may be made of a transparent material, and may be glass or plastic. For example, in case that the cover window CW is glass, the cover window CW may be ultra thin glass (UTG) having a thickness of about 0.1 mm or less. In case that the cover window CW is plastic, the cover window CW may include a transparent polyimide film.

The fingerprint sensor 400 may be disposed on a lower surface of the display panel 100. The fingerprint sensor 400 may be attached onto the lower surface of the display panel 100 by using a transparent adhesive member.

The fingerprint sensor 400 may include a fingerprint sensing layer 410 including sensor pixels SP and a light control layer LCL including a light blocking film LS and a light transmitting film LT. Each of the sensor pixels SP may at least partially overlap the opening area OA of the light control layer LCL in the third direction DR3.

Each of the opening areas OA of the light control layer LCL may be a passage through which light reflected from a ridge RID and a valley VAL of a fingerprint of the finger F is incident. In case that the finger F of the user touches the cover window CW, the light output from the display panel 100 may be reflected from the ridge and the valley of the fingerprint of the finger F. The light reflected from the finger F may be incident on the sensor pixels SP of the fingerprint sensing layer 410 through the display panel 100 and the opening areas OA of the light control layer LCL.

A range LR of light incident on the sensor pixel SP through the opening areas OA of the light control layer LCL may be shorter than a distance FP between the ridge RID and the valley VAL of the finger F. The distance FP between the ridge RID and the valley VAL of the fingerprint of the finger F may be about 500 μm. As a result, depending on whether the light is reflected from the ridge of the fingerprint of the finger F or is reflected from the valley of the fingerprint of the finger F, the sensing current flowing through the light sensing element of each of the sensor pixels SP may be different. Therefore, depending on whether the light is reflected from the ridge of the fingerprint of the finger F or is reflected from the valley of the fingerprint of the finger F, the sensing voltages output from the sensor pixels SP may be different. Accordingly, the fingerprint driving circuit 510 may recognize the fingerprint pattern of the finger F according to the sensing voltages of the sensor pixels SP.

Referring to FIG. 15, the fingerprint sensor 400 may include a fingerprint sensing layer 410 and a light control layer LCL disposed on the fingerprint sensing layer 410.

The fingerprint sensing layer 410 may include sensor pixels SP that sense light. Each of the sensor pixels SP may include a second thin film transistor ST2 and a light sensing element PD.

A buffer film BF may be disposed on a fingerprint sensor substrate FSUB. The fingerprint sensor substrate FSUB may be made of an insulating material such as a polymer resin. For example, the fingerprint sensor substrate FSUB may include polyimide. The fingerprint sensor substrate FSUB may be a flexible substrate that is bendable, foldable, rollable, or the like.

The buffer film BF may be a film for protecting the thin film transistor and the light sensing element PD of the fingerprint sensing layer 410 from moisture permeating through the fingerprint sensor substrate FSUB, which is vulnerable to moisture permeation. The buffer film BF may include inorganic films that are alternately stacked. For example, the buffer film BF may be formed as multiple layers in which one or more inorganic films of a silicon nitride layer, a silicon oxynitride layer, a silicon oxide layer, a titanium oxide layer, and an aluminum oxide layer are alternately stacked.

A second active layer ACT2 of a second thin film transistor ST2 may be disposed on the buffer film BF. The second active layer ACT2 of the second thin film transistor ST2 may include polycrystalline silicon, single crystal silicon, low-temperature polycrystalline silicon, amorphous silicon, or an oxide semiconductor. The second active layer ACT2 of the second thin film transistor ST2 exposed without being covered by the second gate insulating film GI2 may be doped with impurities or ions, and thus may have conductivity. Therefore, a second source electrode S2 and a second drain electrode D2 of the second active layer ACT2 of the second thin film transistor ST2 may be formed.

A second gate insulating film GI2 may be disposed on the second active layer ACT2 of the second thin film transistor ST2. It is illustrated in FIG. 15 that the second gate insulating film GI2 is disposed between the second gate electrode G2 and the second active layer ACT2 of the second thin film transistor ST2 and between a first fingerprint capacitor electrode FCE1 and the buffer film BF, but embodiments are not limited thereto. The second gate insulating film GI2 may also be disposed between the first insulating film INS1 and the second active layer ACT2 and between the first insulating film INS1 and the buffer film BF. The second gate insulating film GI2 may be formed as an inorganic film, for example, a silicon nitride layer, a silicon oxynitride layer, a silicon oxide layer, a titanium oxide layer, or an aluminum oxide layer.

The second gate electrode G2 of the second thin film transistor ST2 and the first fingerprint capacitor electrode FCE1 may be disposed on the second gate insulating film GI2. The second gate electrode G2 of the second thin film transistor ST2 may overlap the second active layer ACT2 in the third direction DR3. The second gate electrode G2 of the second thin film transistor ST2 and the first fingerprint capacitor electrode FCE1 may be formed as a single layer or multiple layers made of any one of molybdenum (Mo), aluminum (Al), chromium (Cr), gold (Au), titanium (Ti), nickel (Ni), neodymium (Nd), and copper (Cu), or an alloy thereof.

A first insulating film INS1 may be disposed on the second gate electrode G2 of the second thin film transistor ST2 and the first fingerprint capacitor electrode FCE1. The first insulating film INS1 may be formed as an inorganic film, for example, a silicon nitride layer, a silicon oxynitride layer, a silicon oxide layer, a titanium oxide layer, or an aluminum oxide layer. The first insulating film INS1 may include inorganic films.

A light sensing element PD and a second fingerprint capacitor electrode FCE2 may be disposed on the first insulating film INS1. The second fingerprint capacitor electrode FCE2 may overlap the first fingerprint capacitor electrode FCE1 in the third direction DR3. Since the first insulating film INS1 has a certain dielectric constant, a capacitor may be formed by the first fingerprint capacitor electrode FCE1, the second fingerprint capacitor electrode FCE2, and the first insulating film INS1 disposed between the first fingerprint capacitor electrode FCE1 and the second fingerprint capacitor electrode FCE2.

The light sensing element PD may be formed as a photodiode as illustrated in FIG. 15, but embodiments are not limited thereto. The light sensing element PD may be formed as a photo transistor. The light sensing element PD may include a first sensing electrode PCE, a light sensing semiconductor layer PSEM, and a second sensing electrode PAE. The first sensing electrode PCE may be a cathode electrode, and the second sensing electrode PAE may be an anode electrode.

The first sensing electrode PCE may be disposed on the first insulating film INS1. The first sensing electrode PCE and the second fingerprint capacitor electrode FCE2 may be formed of the same material. The first sensing electrode PCE and the second fingerprint capacitor electrode FCE2 may be formed as a single layer made of molybdenum (Mo), titanium (Ti), copper (Cu), or aluminum (Al) or be formed as a stacked structure (Ti/Al/Ti) of aluminum and titanium, a stacked structure (ITO/Al/ITO) of aluminum and ITO, an APC alloy, and a stacked structure (ITO/APC/ITO) of an APC alloy and ITO.

The light sensing semiconductor layer PSEM may be disposed on the first sensing electrode PCE. The light sensing semiconductor layer PSEM may be formed in a PIN structure in which a P-type semiconductor layer PL, an I-type semiconductor layer IL, and an N-type semiconductor layer NL are sequentially stacked. In case that the light sensing semiconductor layer PSEM is formed in the PIN structure, the I-type semiconductor layer IL may be depleted by the P-type semiconductor layer PL and the N-type semiconductor layer NL, and an electric field may be generated therein, and holes and electrons generated by sunlight may be drifted by the electric field. As a result, the holes may be collected to the second sensing electrode PAE through the P-type semiconductor layer PL, and the electrons may be collected to the first sensing electrode PCE through the N-type semiconductor layer NL.

The P-type semiconductor layer PL may be disposed close to a surface on which external light is incident, and the N-type semiconductor layer NL may be disposed far from a surface on which external light is incident. Since drift mobility of holes is low by drift mobility of electrons, the P-type semiconductor layer PL may be formed to be close to the incident surface of external light in order to maximize an efficiency of collecting the incident light.

The N-type semiconductor layer NL may be disposed on the first sensing electrode PCE, the I-type semiconductor layer IL may be disposed on the N-type semiconductor layer NL, and the P-type semiconductor layer PL may be disposed on the I-type semiconductor layer IL. For example, the P-type semiconductor layer PL may be formed by doping amorphous silicon (a-Si:H) with a P-type dopant. The I-type semiconductor layer IL may be formed of amorphous silicon germanium (a-SiGe:H) or amorphous silicon carbide (a-SiC:H). The N-type semiconductor layer NL may be formed by doping amorphous silicon germanium (a-SiGe:H) or amorphous silicon carbide (a-SiC:H) with an N-type dopant. The P-type semiconductor layer PL and the N-type semiconductor layer NL may be formed to a thickness of about 500 Å, and the I-type semiconductor layer IL may be formed to have a thickness of about 5,000 Å to about 10,000 Å.

In another example, the N-type semiconductor layer NL may be disposed on the first sensing electrode PCE, the I-type semiconductor layer IL may be omitted, and the P-type semiconductor layer PL may be disposed on the N-type semiconductor layer NL. For example, the P-type semiconductor layer PL may be formed by doping amorphous silicon (a-Si:H) with a P-type dopant. The N-type semiconductor layer NL may be formed by doping amorphous silicon germanium (a-SiGe:H) or amorphous silicon carbide (a-SiC:H) with an N-type dopant. The P-type semiconductor layer PL and the N-type semiconductor layer NL may be formed to have a thickness of about 500 Å.

For example, an upper or lower surface of at least one of the first sensing electrode PCE, the P-type semiconductor layer PL, the I-type semiconductor layer IL, the N-type semiconductor layer NL, and the second sensing electrode PAE may be formed into a concavo-convex structure through a texturing processing process to increase an absorption rate of external light. The texture processing process may form a surface of a material into a rugged concavo-convex structure, which is a process of processing the same shape as a surface of a fabric. The texture processing process may be performed through an etching process using photolithography, an anisotropic etching process using a chemical solution, or a groove forming process using mechanical scribing.

The second sensing electrode PAE may be disposed on the P-type semiconductor layer PL. The second sensing electrode PAE may be formed of transparent conductive oxide (TCO) such as indium tin oxide (ITO) and indium zinc oxide (IZO) capable of transmitting light.

A second insulating film INS2 may be disposed on the light sensing element PD and the second fingerprint capacitor electrode FCE2. The second insulating film INS2 may be formed as an inorganic film, for example, a silicon nitride layer, a silicon oxynitride layer, a silicon oxide layer, a titanium oxide layer, or an aluminum oxide layer. The second insulating film INS2 may include inorganic films.

A first connection electrode CE1, a second connection electrode CE2, and a third connection electrode CE3 may be disposed on the second insulating film INS2.

The first connection electrode CE1 may be connected (e.g., electrically connected) to the second source electrode S2 of the second thin film transistor ST2 through a source contact hole SCT which penetrates through the first insulating film INS1 and the second insulating film INS2 and exposes the second source electrode S2 of the second thin film transistor ST2.

The second connection electrode CE2 may be connected (e.g., electrically connected) to the second drain electrode D2 of the second thin film transistor ST2 through a drain contact hole DCT which penetrates through the first insulating film INS1 and the second insulating film INS2 and exposes the second drain electrode D2 of the second thin film transistor ST2. The second connection electrode CE2 may be connected (e.g., electrically connected) to the first sensing electrode PCE through a first sensing contact hole RCT1 which penetrates through the second insulating film INS2 and exposes the first sensing electrode PCE. As a result, the drain electrode D2 of the second thin film transistor ST2 and the first sensing electrode PCE of the light sensing element PD may be connected (e.g., electrically connected) through the second connection electrode CE2.

The third connection electrode CE3 may be connected (e.g., electrically connected) to the second sensing electrode PAE through a second sensing contact hole RCT2 which penetrates through the second insulating film INS2 and exposes the second sensing electrode PAE.

The first connection electrode CE1, the second connection electrode CE2, and the third connection electrode CE3 may be formed of a single layer or multiple layers made of any one of molybdenum (Mo), aluminum (Al), chromium (Cr), gold (Au), titanium (Ti), nickel (Ni), neodymium (Nd), and copper (Cu), or an alloy thereof.

A third insulating film INS3 may be disposed on the first connection electrode CE1, the second connection electrode CE2, and the third connection electrode CE3. The third insulating film INS3 may be formed as an inorganic film, for example, a silicon nitride layer, a silicon oxynitride layer, a silicon oxide layer, a titanium oxide layer, or an aluminum oxide layer. The third insulating film INS3 may include inorganic films. In another example, the third insulating film INS3 may be omitted.

A planarization film PLA may be disposed on the third insulating film INS3. The planarization film PLA may be formed as an organic film such as an acrylic resin, an epoxy resin, a phenolic resin, a polyamide resin, or a polyimide resin.

A description of the light control layer LCL is the same as that in the embodiments described above and will be thus omitted for descriptive convenience. In FIG. 15, the case where the fingerprint sensor 400 includes the light control layer LCL according to the embodiment of FIG. 7 is described as an example, but embodiments are not limited thereto. The fingerprint sensor 400 is not limited to any one of the light control layers LCL according to all of the above-described embodiments.

As in the above-described embodiments, the light control layer LCL may also be disposed (e.g., directly disposed) on the display panel 100, and the light control layer LCL may also be disposed on the fingerprint sensing layer 410 in the fingerprint sensor 400.

As the fingerprint sensor 400 of the display device 10 includes the light control layer LCL of the above-described embodiments, noise light may be removed, and thus fingerprint recognition accuracy may be improved.

Hereinafter, a method for manufacturing a display device will be described.

Figure 16:
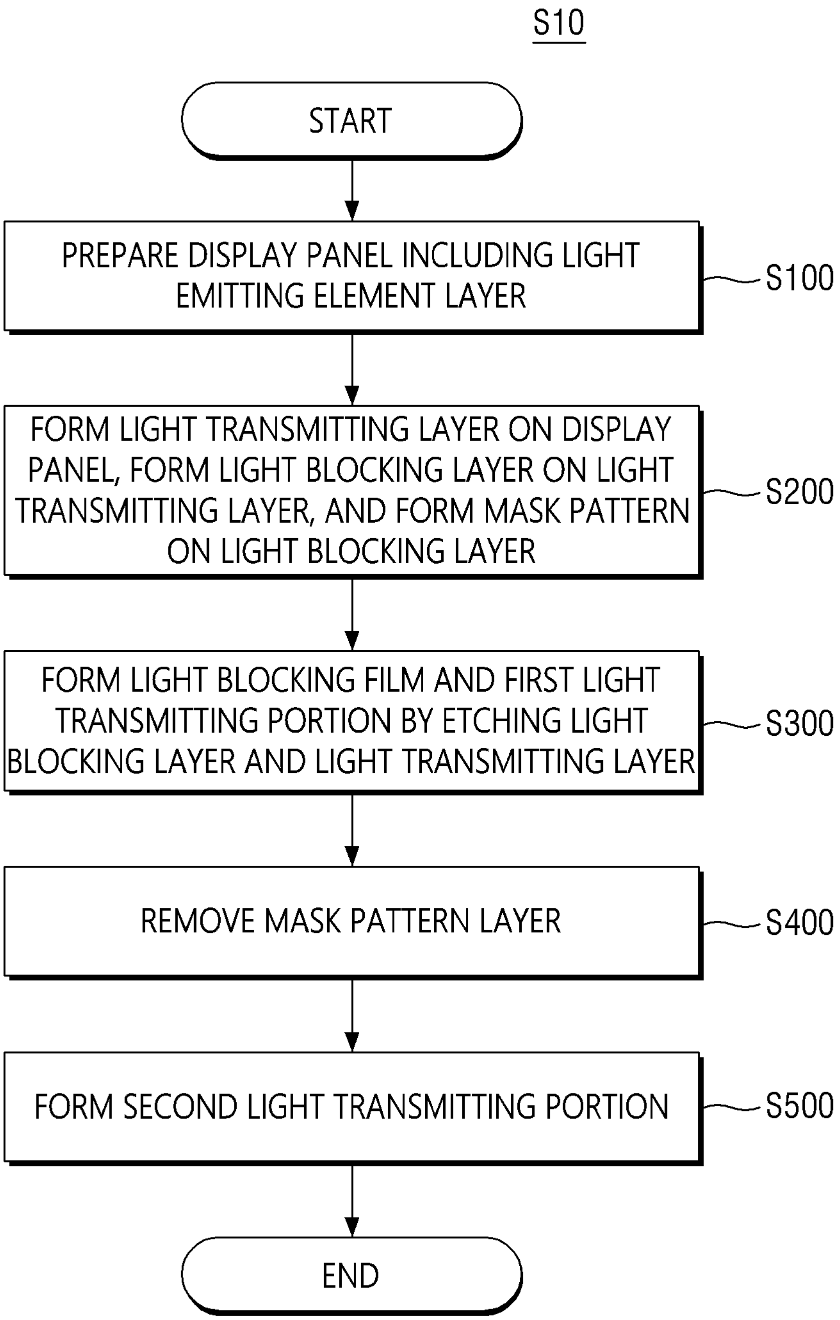
FIG. 16 is a flowchart illustrating a method for manufacturing a display device according to an embodiment.
Figure 17:
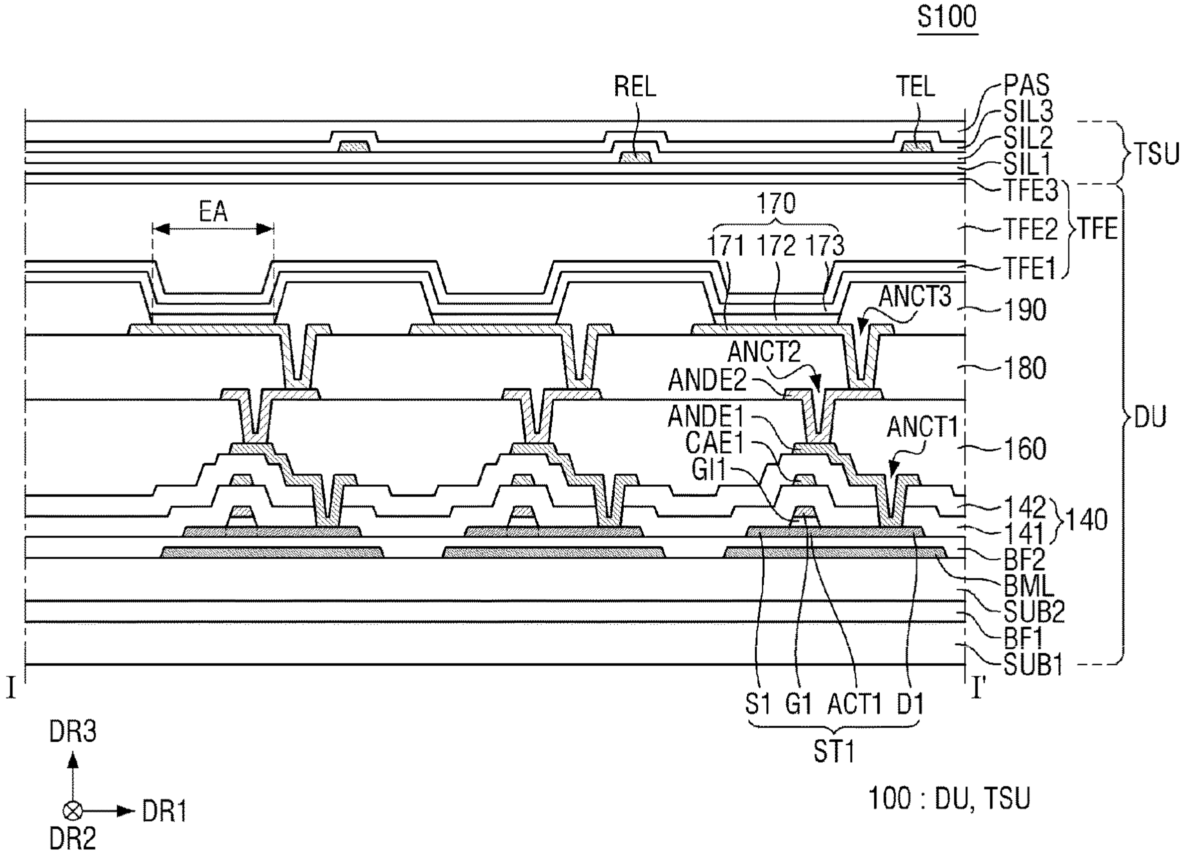
FIG. 17 is a schematic cross-sectional view illustrating a step S100 of FIG. 16.
Figure 18:
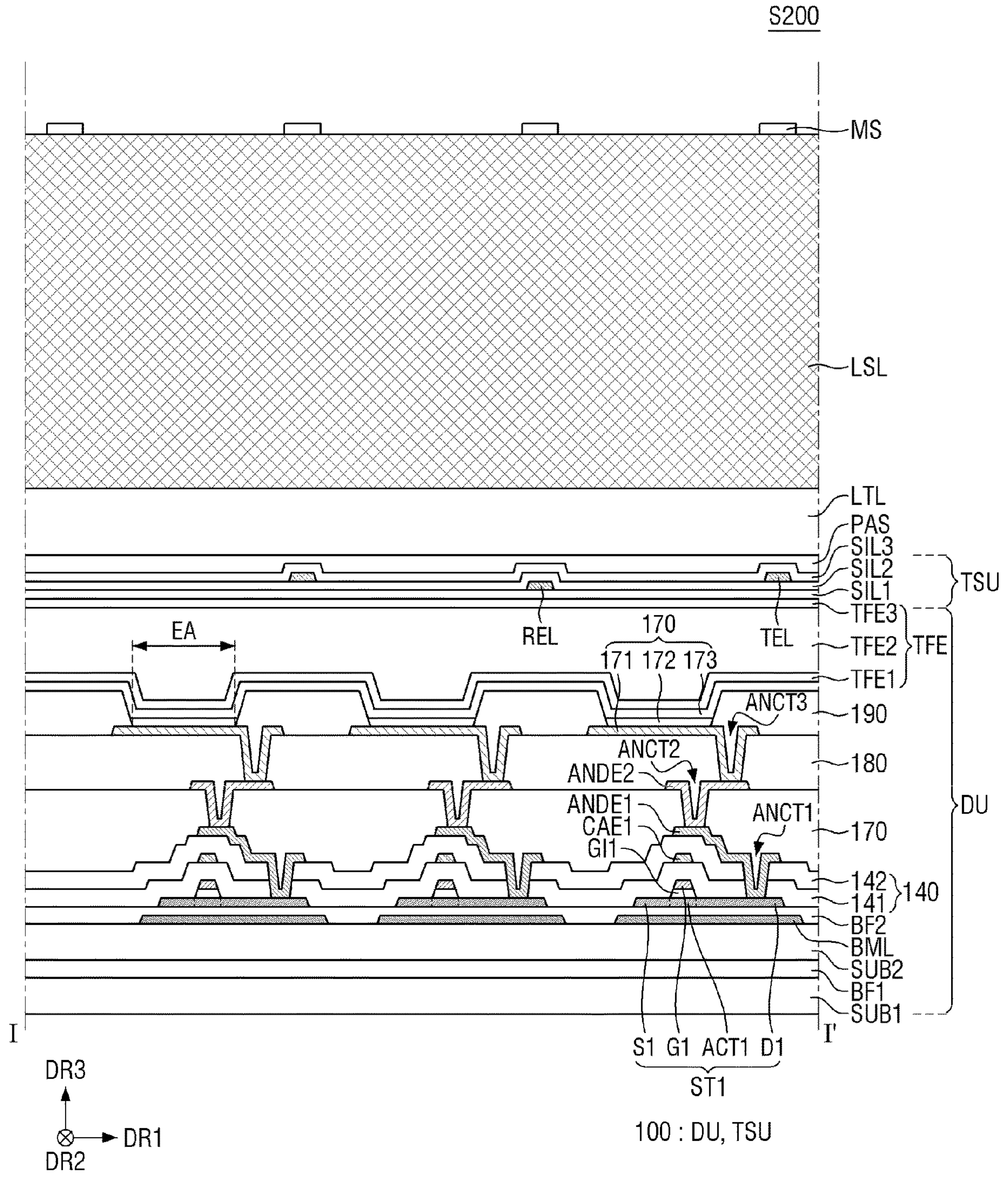
FIG. 18 is a schematic cross-sectional view illustrating a step S200 of FIG. 16.
Figure 19:
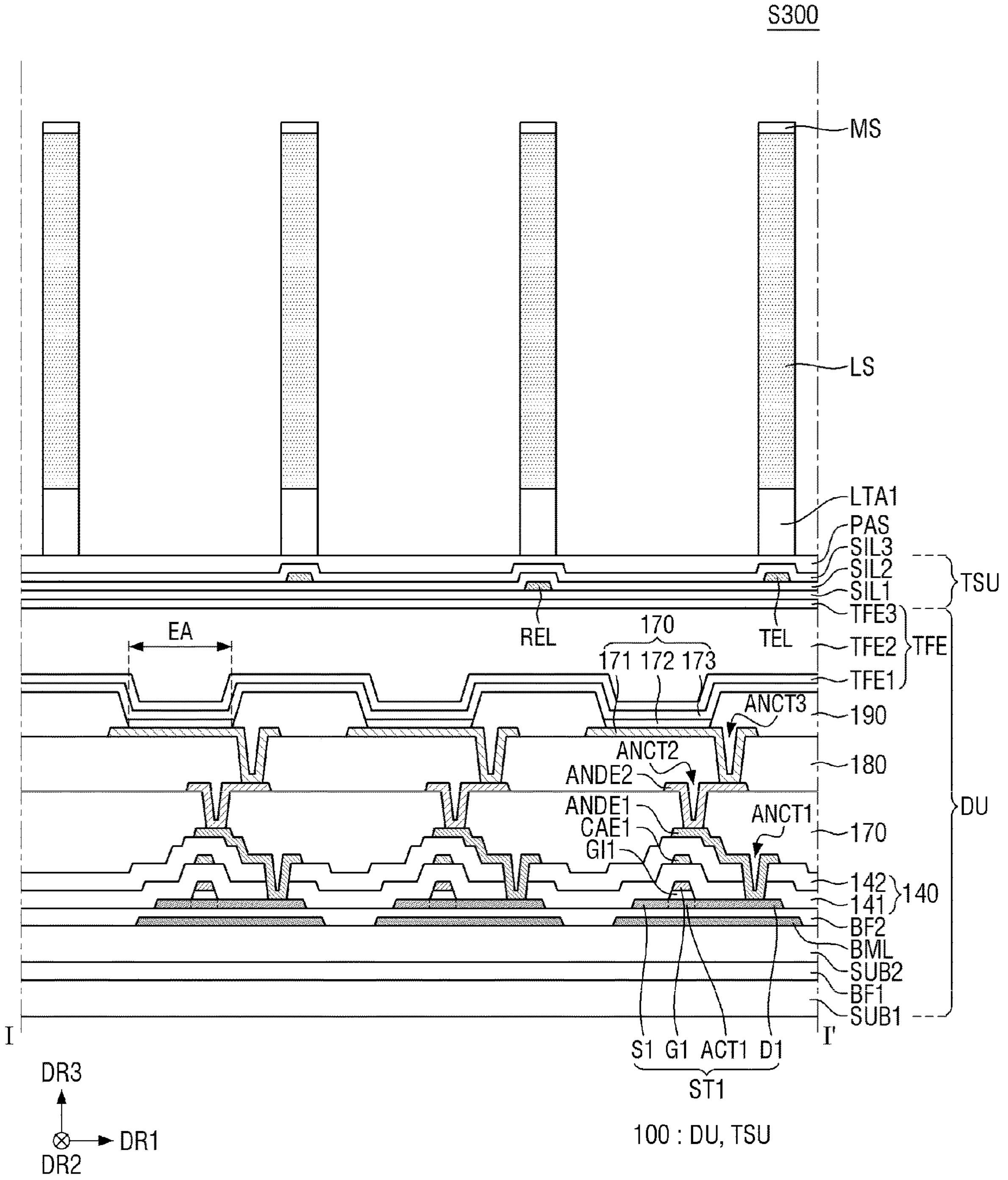
FIG. 19 is a schematic cross-sectional view illustrating a step S300 of FIG. 16.
Figure 20:
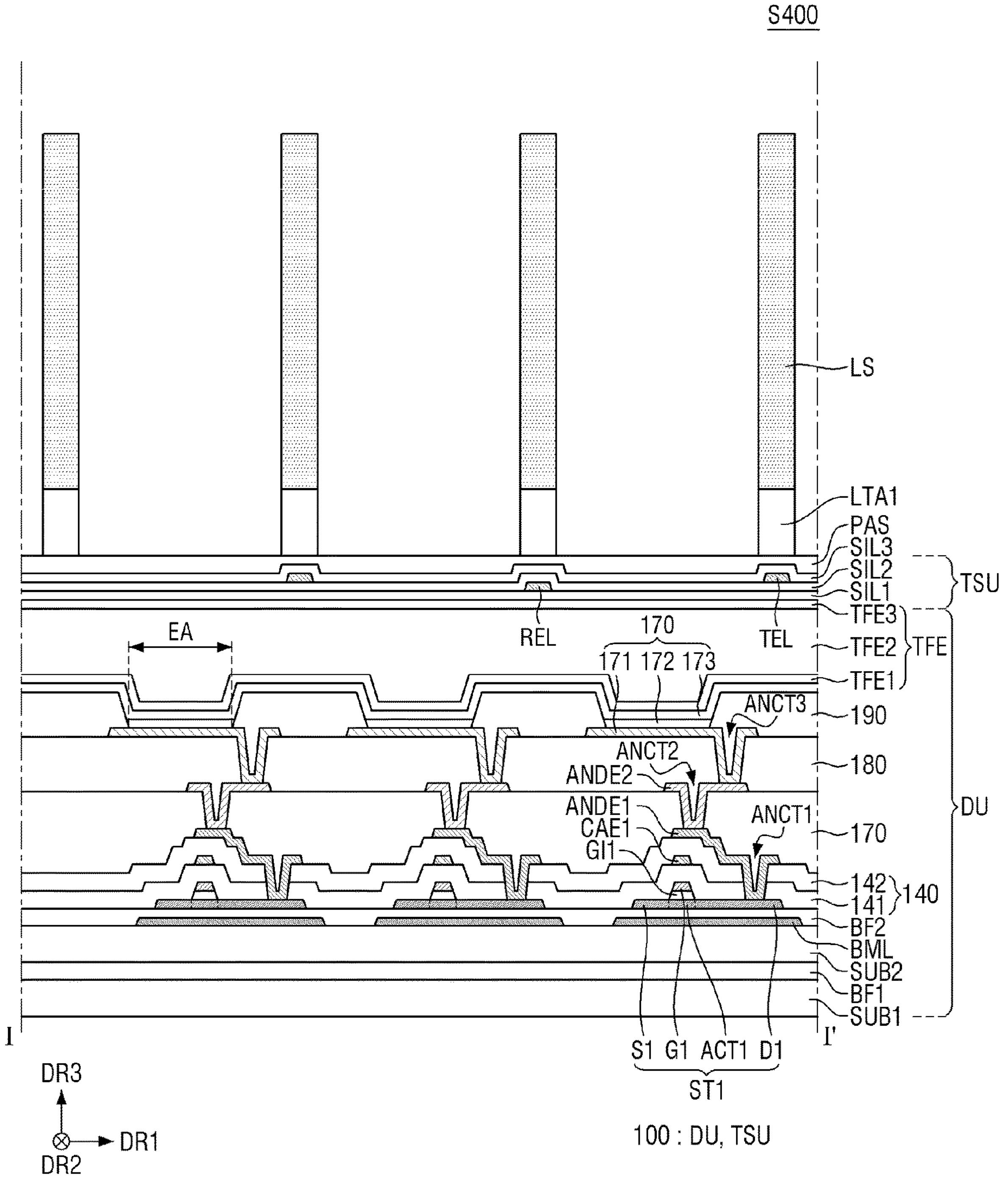
FIG. 20 is a schematic cross-sectional view illustrating a step S400 of FIG. 16.
Figure 21:
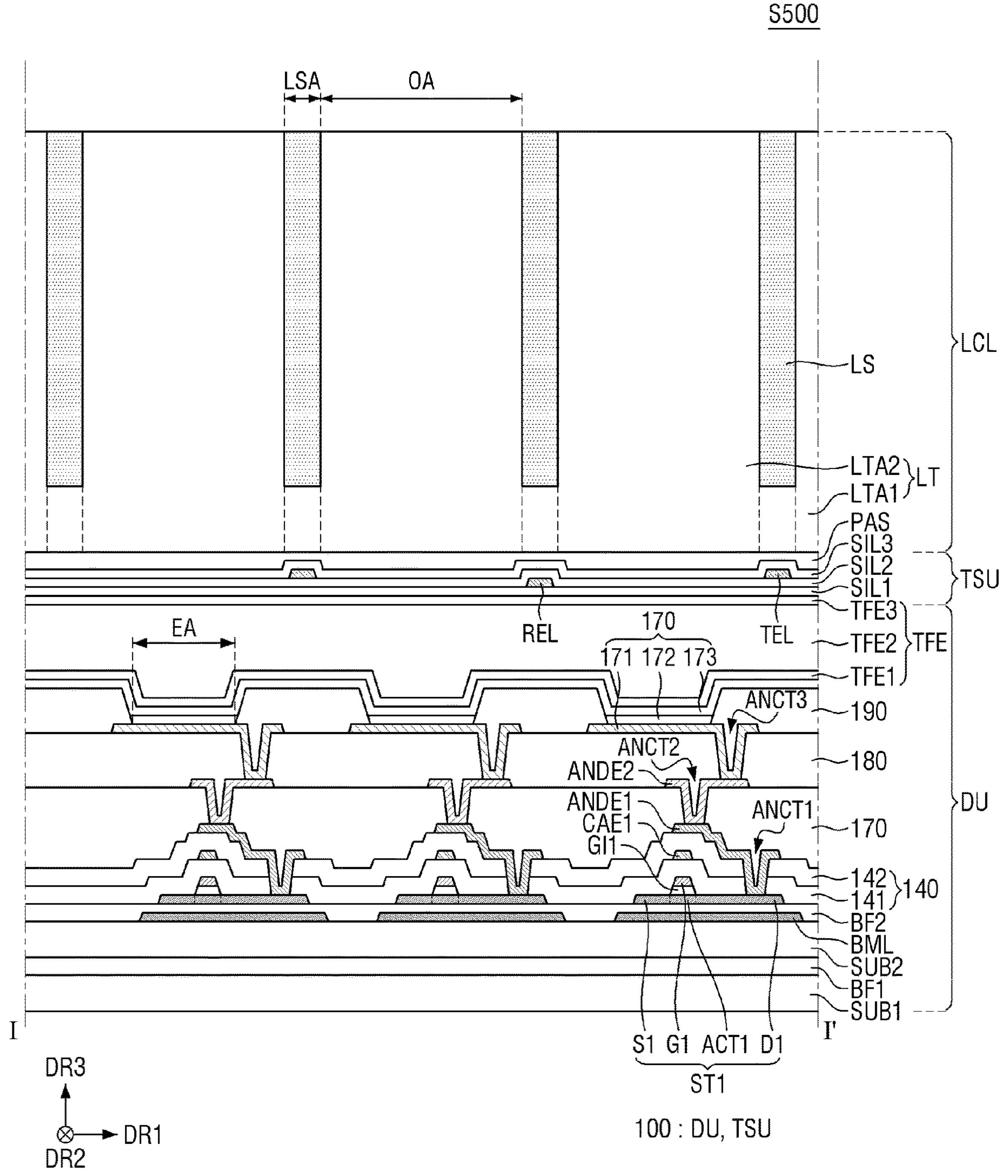
FIG. 21 is a schematic cross-sectional view illustrating a step S500 of FIG. 16.

FIG. 16 is a flowchart illustrating a method for manufacturing a display device according to an embodiment. FIG. 17 is a schematic cross-sectional view illustrating a step S100 of FIG. 16. FIG. 18 is a schematic cross-sectional view illustrating a step S200 of FIG. 16. FIG. 19 is a schematic cross-sectional view illustrating a step S300 of FIG. 16. FIG. 20 is a schematic cross-sectional view illustrating a step S400 of FIG. 16. FIG. 21 is a schematic cross-sectional view illustrating a step S500 of FIG. 16.

FIGS. 16 to 21 are schematic views illustrating a method S10 for manufacturing the display device 10 according to the embodiment described with reference to FIG. 1A and the like.

Referring to FIGS. 16 to 21, a method S10 for manufacturing a display device according to an embodiment may include preparing a display panel 100 including a light emitting element layer (S100), forming a light transmitting layer LTL on the display panel 100, forming a light blocking layer LSL on the light transmitting layer LTL, and forming a mask pattern layer on the light blocking layer LSL (S200), forming a light blocking film and a first light transmitting portion LTA1 by etching the light blocking layer LSL and the light transmitting layer LTL (S300), removing the mask pattern layer (S400), and forming a second light transmitting portion LTA2 (S500).

In the step of preparing the display panel 100 including the light emitting element layer (S100), the display panel 100 may be prepared. A description of the display panel 100 is the same as that in the embodiments described above and will be thus omitted for descriptive convenience.

In the step of forming the light transmitting layer LTL on the display panel 100, forming the light blocking layer LSL on the light transmitting layer LTL, and forming the mask pattern layer on the light blocking layer LSL (S200), a light transmitting layer LTL, a light blocking layer LSL, and a mask pattern layer MS may be formed on the display panel 100.

The light transmitting layer LTL may be formed by depositing a transparent organic material on the display panel 100. The light transmitting layer LTL may have a thickness of about 2 μm to about 8 μm. The light transmitting layer LTL may include an organic film made of an acryl resin, an epoxy resin, a phenolic resin, a polyamide resin, a polyimide resin, or the like.

The light blocking layer LSL may be formed by depositing a light blocking organic material on the light transmitting layer LTL. The light blocking layer LSL may have a thickness of about 10 μm to about 25 μm. The light blocking layer LSL may include an organic material including an organic black pigment such as carbon black, as a photosensitive resin capable of absorbing or blocking light.

The mask pattern layer MS may be formed by depositing an organic material or an inorganic material on the light blocking layer LSL. The mask pattern layer MS may be an organic film such as photoresist. In another example, the mask pattern layer MS may be transparent conductive oxide (TCO) such as indium tin oxide (ITO) or indium zinc oxide (IZO), and an inorganic film such as aluminum (Al).

In the step of forming the light blocking film and the first light transmitting portion LTA1 by etching the light blocking layer LSL and the light transmitting layer LTL (S300), the light blocking film LS and the first light transmitting portion LTA1 may be formed by etching the light blocking layer LSL and the light transmitting layer LTL.

The light blocking film LS may be formed by dry etching the light blocking layer LSL not covered by the mask pattern layer MS. Openings disposed in row and column directions may be formed in the light blocking layer LSL.

After etching the light blocking layer LSL, the first light transmitting portion LTA1 may be formed by dry etching the light transmitting layer LTL not covered by the mask pattern layer MS and the light blocking film LS. Openings disposed in row and column directions may be formed in the first light transmitting portion LTA1.

In the step of removing the mask pattern layer MS (S400), the mask pattern layer MS may be removed through a strip process or an etching process. In some embodiments, the mask pattern layer MS may not be removed. For example, as in the display device 10 of an embodiment described with reference to FIG. 8 and the like, the display device 10 may further include the third light transmitting portion LTA3 (see FIG. 8).

In the step of forming the second light transmitting portion LTA2 (S500), the second light transmitting portion LTA2 may be formed by filling or depositing a transparent organic material.

Second light transmitting portions LTA2 may be formed by filling or depositing a transparent organic material in the openings formed in the light blocking film LS and the openings formed in the first light transmitting portion LTA1. The second light transmitting portions LTA2 may be disposed to be spaced apart from each other along the first and second directions DR1 and DR2. Side surfaces of the second light transmitting portions LTA2 may be surrounded by the light blocking film LS and the first light transmitting portion LTA1.

The second light transmitting portion LTA2 and the first light transmitting portion LTA1 may be formed of the same material. The first light transmitting portion LTA1 and the second light transmitting portion LTA2 may form an integral light transmitting film LT.

According to the method S10 for manufacturing the display device, a process of removing the light blocking film LS, which is formed higher than the light transmitting film LT, may not be performed by forming the second light transmitting portion LTA2 inside the opening of the previously formed light blocking film LS instead of forming an opening in the light transmitting film and forming the light blocking film LS inside the opening. Accordingly, process efficiency may be improved, and damage to the light transmitting film LT occurring in the process of removing the light blocking film LS may be prevented.

Figure 22:
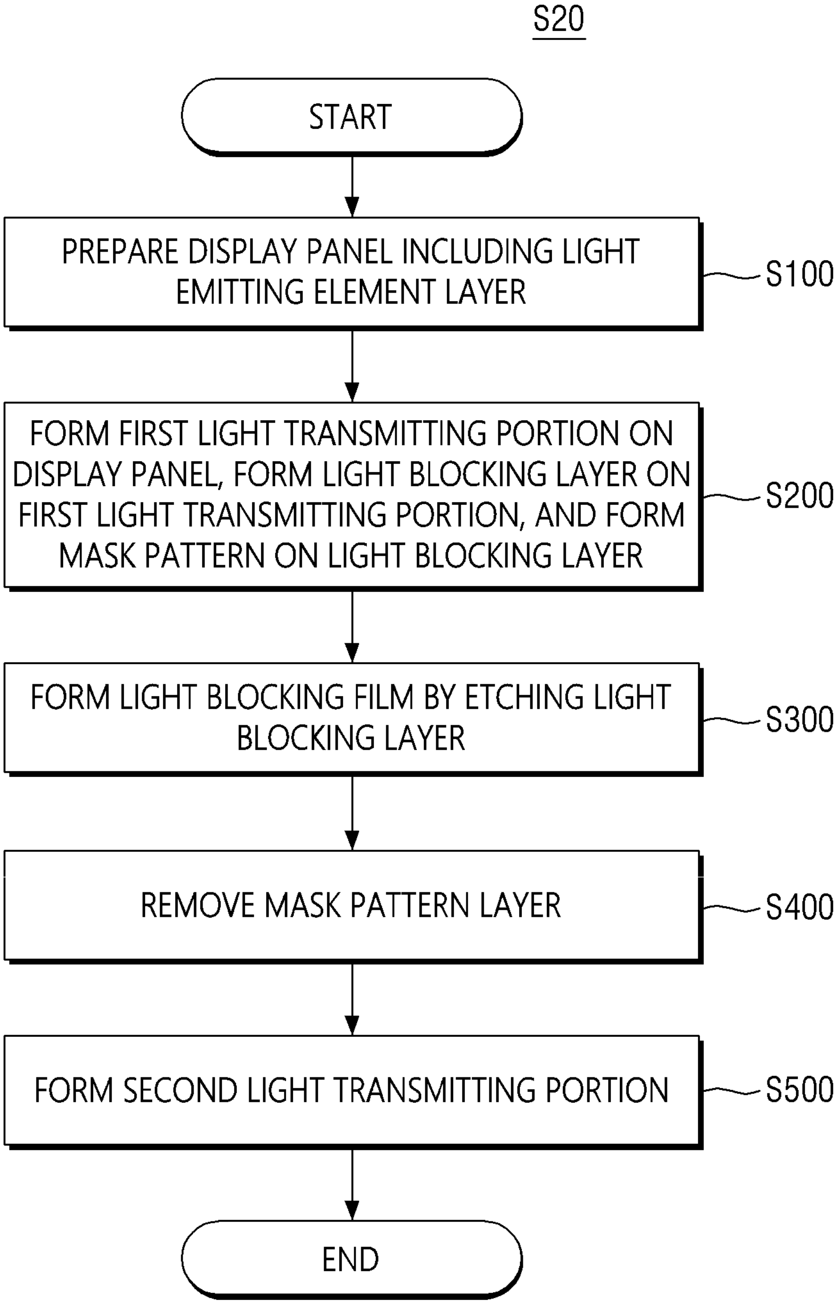
FIG. 22 is a flowchart illustrating a method for manufacturing a display device according to an embodiment.
Figure 23:
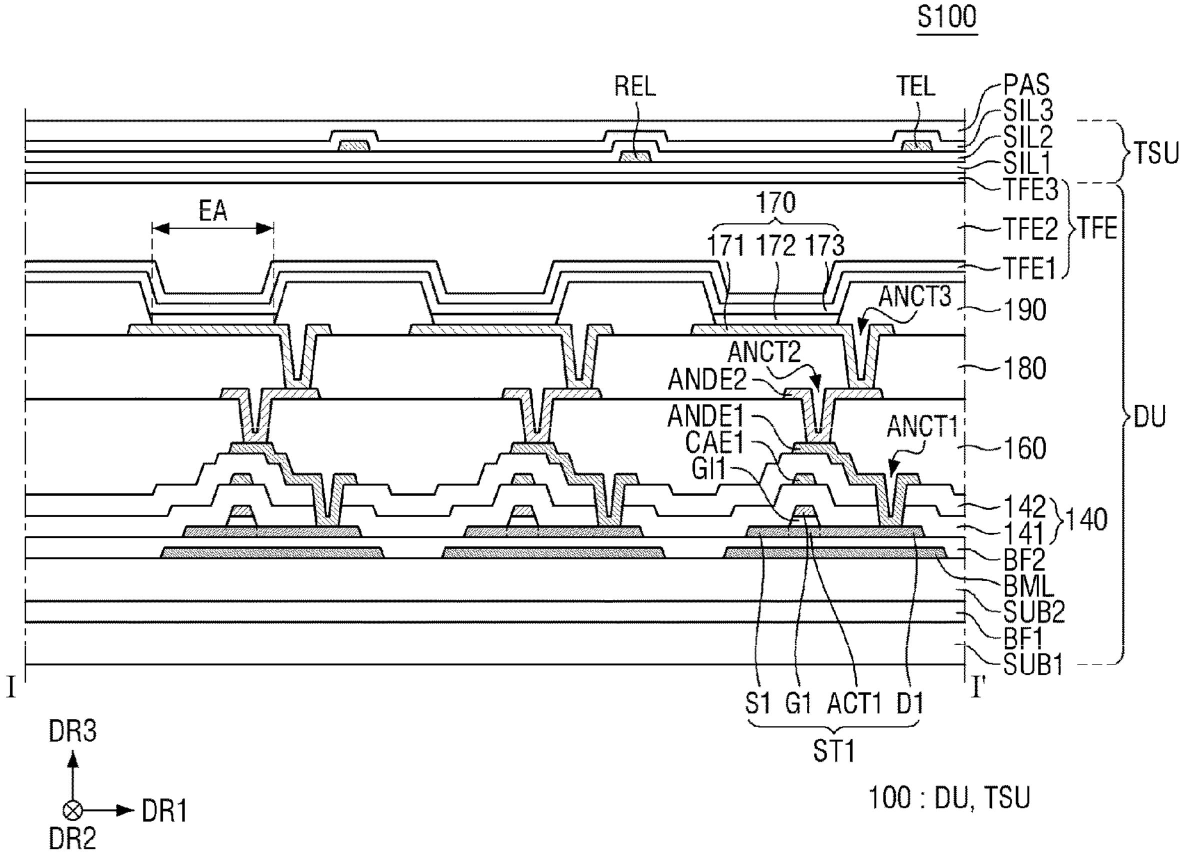
FIG. 23 is a schematic cross-sectional view illustrating a step S100 of FIG. 22.
Figure 24:
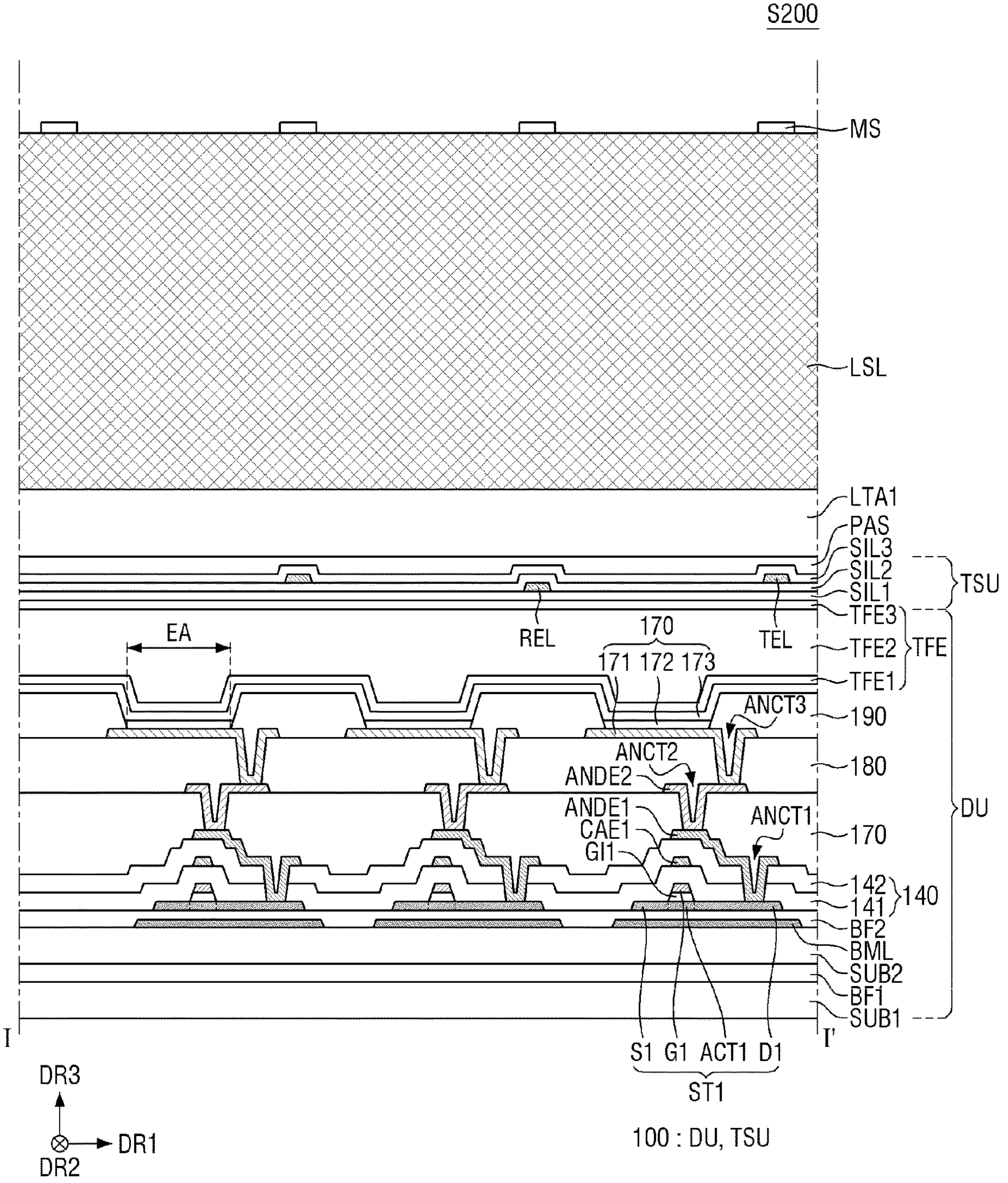
FIG. 24 is a schematic cross-sectional view illustrating a step S200 of FIG. 22.
Figure 25:
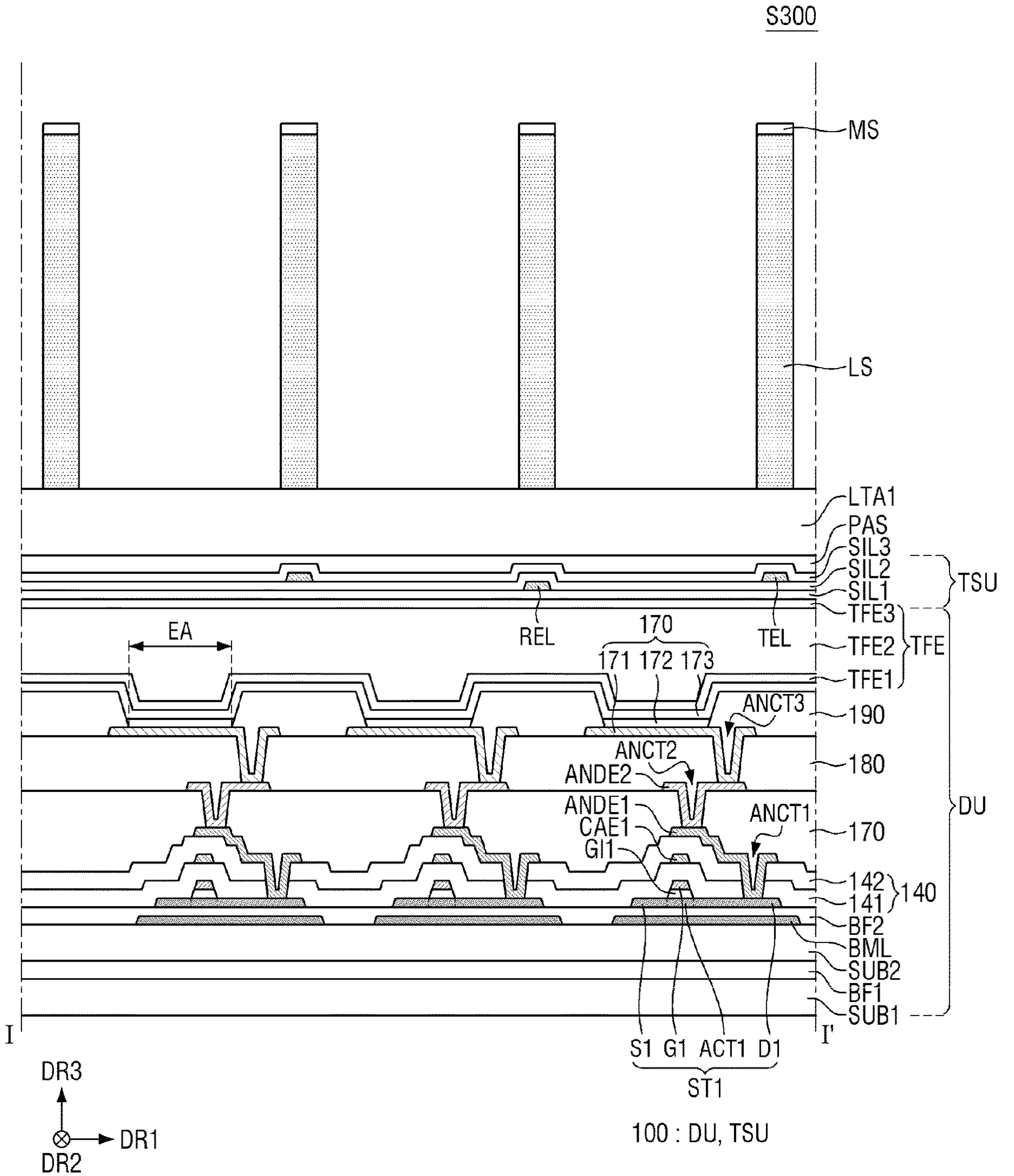
FIG. 25 is a schematic cross-sectional view illustrating a step S300 of FIG. 22.
Figure 26:
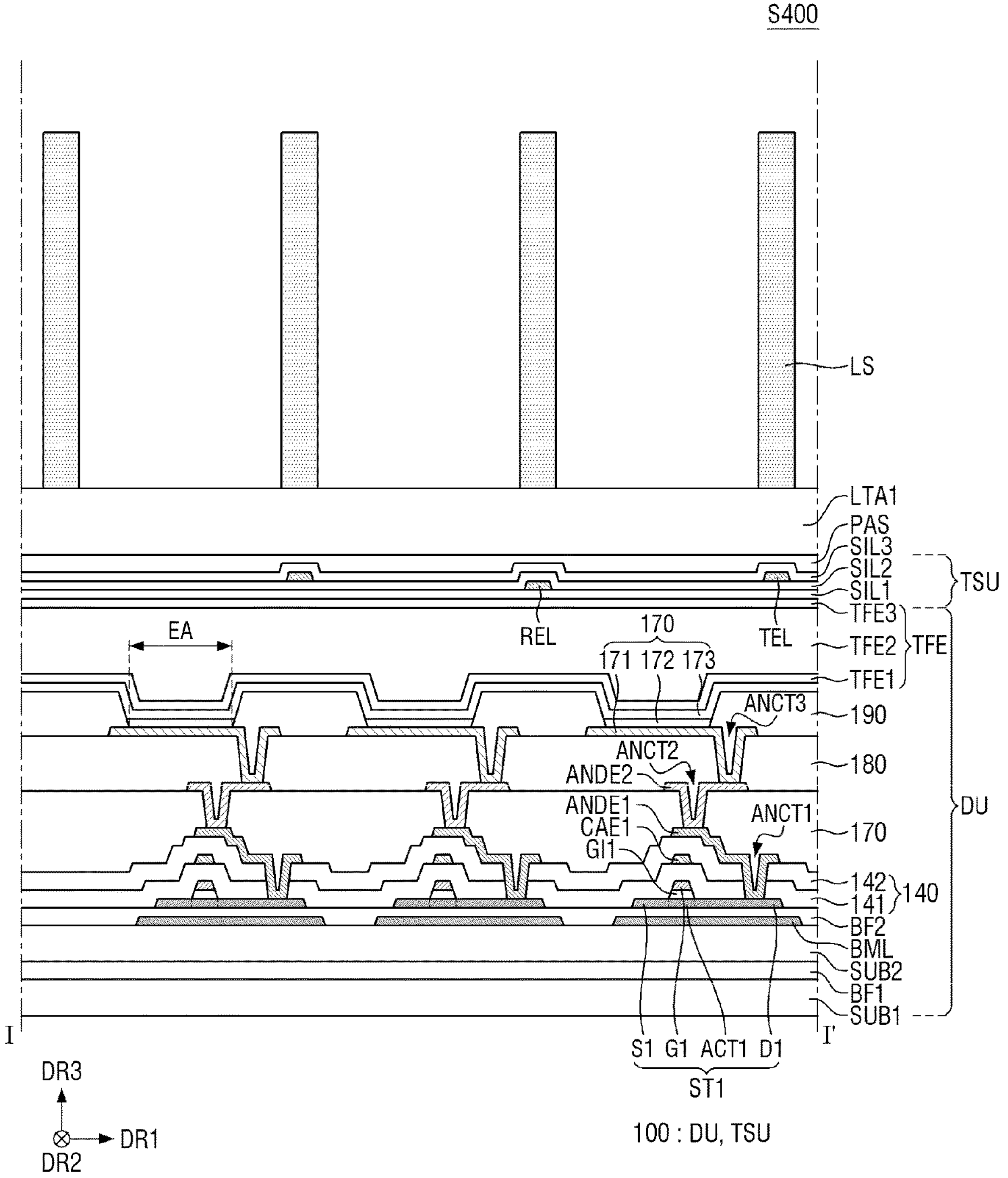
FIG. 26 is a schematic cross-sectional view illustrating a step S400 of FIG. 22.
Figure 27:
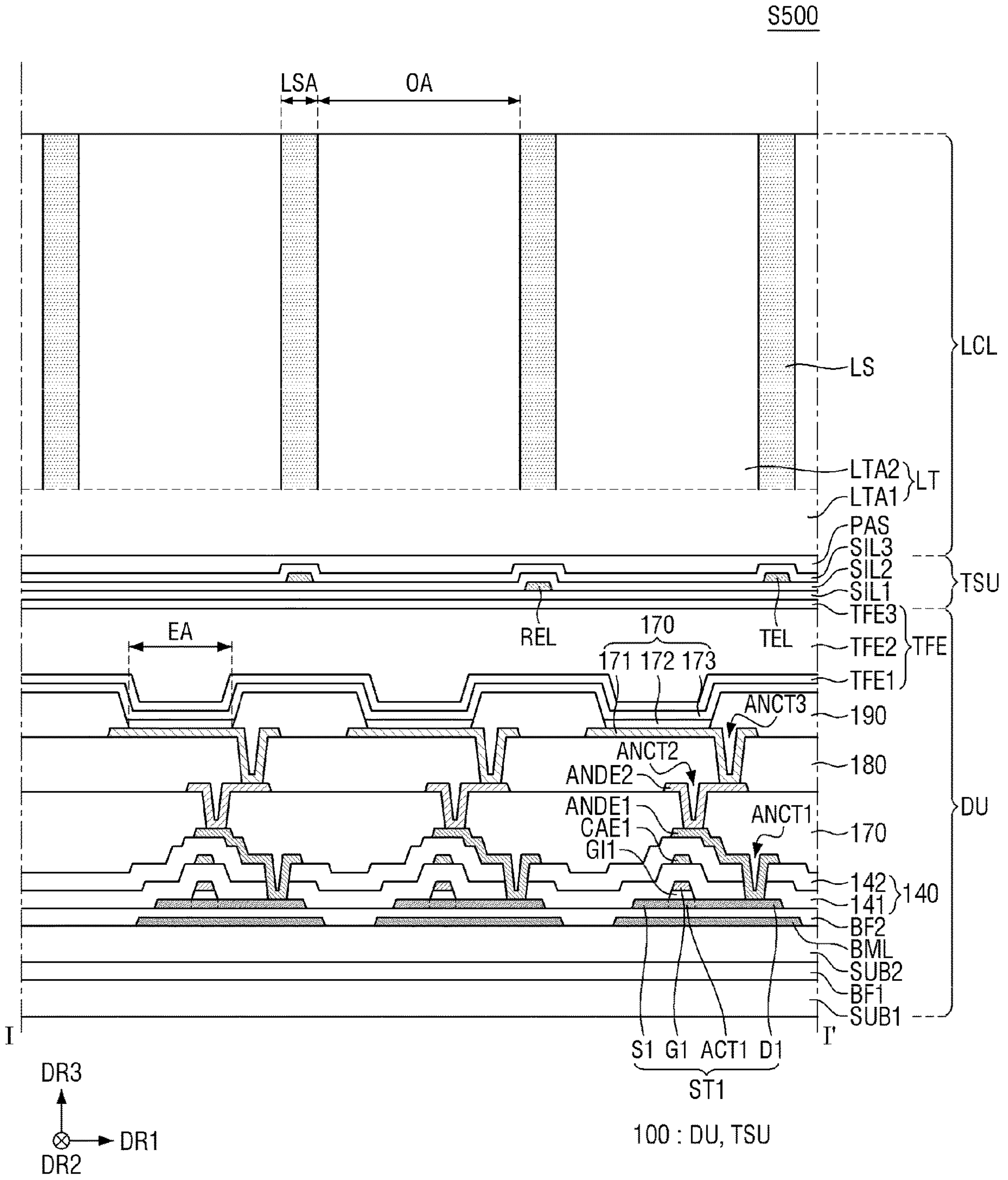
FIG. 27 is a schematic cross-sectional view illustrating a step S500 of FIG. 22.

FIG. 22 is a flowchart illustrating a method for manufacturing a display device according to an embodiment. FIG. 23 is a schematic cross-sectional view illustrating a step S100 of FIG. 22. FIG. 24 is a schematic cross-sectional view illustrating a step S200 of FIG. 22. FIG. 25 is a schematic cross-sectional view illustrating a step S300 of FIG. 22. FIG. 26 is a schematic cross-sectional view illustrating a step S400 of FIG. 22. FIG. 27 is a schematic cross-sectional view illustrating a step S500 of FIG. 22.

FIGS. 22 to 27 are schematic views illustrating a method S20 for manufacturing the display device 10 according to an embodiment described with reference to FIG. 11.

Referring to FIGS. 22 to 27, a method S20 for manufacturing a display device according to an embodiment may include preparing a display panel 100 including a light emitting element layer (S100), forming a first light transmitting portion on the display panel 100, forming a light blocking layer LSL on the first light transmitting portion LTA1, and forming a mask pattern layer MS on the light blocking layer LSL (S200), forming a light blocking film by etching the light blocking layer LSL (S300), removing the mask pattern layer MS (S400), and forming a second light transmitting portion LTA2 (S500).

In the step of preparing the display panel 100 including the light emitting element layer (S100), the display panel 100 may be prepared. A description of the display panel 100 is the same as that in the embodiments described above and will be thus omitted for descriptive convenience.

In the step of forming the first light transmitting portion LTA1 on the display panel 100, forming the light blocking layer LSL on the first light transmitting portion LTA1, and forming the mask pattern layer MS on the light blocking layer LSL (S200), a first light transmitting portion LTA1, a light blocking layer LSL, and a mask pattern layer MS may be formed on the display panel 100.

The first light transmitting portion LTA1 may be formed by depositing a transparent organic material on the display panel 100. The first light transmitting portion LTA1 may have a thickness of about 2 μm to about 8 μm. The first light transmitting portion LTA1 may include an organic film made of an acryl resin, an epoxy resin, a phenolic resin, a polyamide resin, a polyimide resin, or the like.

The light blocking layer LSL may be formed by depositing a light blocking organic material on the first light transmitting portion LTA1. The light blocking layer LSL may have a thickness of about 10 μm to about 25 μm. The light blocking layer LSL may include an organic material including an organic black pigment such as carbon black, as a photosensitive resin capable of absorbing or blocking light.

The mask pattern layer MS may be formed by depositing an organic material or an inorganic material on the light blocking layer LSL. The mask pattern layer MS may be an organic film such as photoresist. In another example, the mask pattern layer MS may be transparent conductive oxide (TCO) such as indium tin oxide (ITO) or indium zinc oxide (IZO), and an inorganic film such as aluminum (Al).

In the step of forming the light blocking film by etching the light blocking layer LSL (S300), the light blocking film LS may be formed by etching the light blocking layer LSL.

The light blocking film LS may be formed by dry etching the light blocking layer LSL not covered by the mask pattern layer MS. Openings disposed in row and column directions may be formed in the light blocking layer LSL.

In the method S20 for manufacturing the display device, the first light transmitting portion LTA1 may not be etched, unlike in the method S10 for manufacturing the display device according to an embodiment described with reference to FIG. 16 and the like. Therefore, the first light transmitting portion LTA1 may overlap the light blocking film LS in the thickness direction.

In the step of removing the mask pattern layer (S400), the mask pattern layer MS may be removed through a strip process or an etching process. In some embodiments, the mask pattern layer may not be removed. For example, as in the display device 10 of an embodiment described with reference to FIG. 8 and the like, the display device 10 may further include the third light transmitting portion LTA3 (see FIG. 8).

In the step of forming the second light transmitting portion LTA2 (S500), the second light transmitting portion LTA2 may be formed by filling or depositing a transparent organic material.

Second light transmitting portions LTA2 may be formed by filling or depositing a transparent organic material in the openings formed in the light blocking film LS. The second light transmitting portions LTA2 may be disposed to be spaced apart from each other along the first and second directions DR1 and DR2. Side surfaces of the second light transmitting portions LTA2 may be surrounded by the light blocking film LS.

In the method S20 for manufacturing the display device, the second light transmitting portion LTA2 may be disposed on the first light transmitting portion LTA1 because the first light transmitting portion LTA1 is not etched, unlike in the method S10 for manufacturing the display device according to an embodiment described with reference to FIG. 16 and the like.

The second light transmitting portion LTA2 may be formed of the same material as the first light transmitting portion LTA1. The first light transmitting portion LTA1 and the second light transmitting portion LTA2 may form an integral light transmitting film LT.

According to the method S20 for manufacturing the display device, as the first light transmitting portion LTA1 is not etched and only the light blocking layer LSL is etched in the etching process, process efficiency may be increased, and an etching depth may be lowered to achieve a vertical profile.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A display device comprising:
- a substrate;
- a light emitting element layer disposed on the substrate and including a plurality of light emitting areas each including a light emitting element that emits light;
- an encapsulation layer disposed on the light emitting element layer; and
- a light control layer disposed on the encapsulation layer, wherein
- the light control layer includes:
  - a light transmitting film that transmits the light, and
  - a light blocking film that blocks the light, and
- the light transmitting film includes:
  - a first light transmitting portion, wherein the first light transmitting portion and the light blocking film overlap each other in a thickness direction of the substrate; and
  - a plurality of second light transmitting portions each surrounded by the light blocking film, and
  - a thickness of the light blocking film is greater than a thickness of the first light transmitting portion,
  - wherein the encapsulation layer is disposed between the light emitting element layer and the light control layer.

2. The display device of claim 1, wherein a first width, which is a width of each of the plurality of second light transmitting portions in a first direction, is greater than a first distance, which is a distance between two adjacent second light transmitting portions among the plurality of second light transmitting portions in the first direction.

3. The display device of claim 2, wherein a ratio of the first distance to the first width is substantially equal to a ratio of the thickness of the first light transmitting portion to the thickness of the light blocking film.

4. The display device of claim 3, wherein the ratio of the first distance to the first width is about 1:9 to about 2:3.

5. The display device of claim 3, wherein
- the first width is about 6 μm to about 9 μm, and
- the first distance is about 1 μm to about 4 μm.

6. The display device of claim 3, wherein
- the thickness of the light blocking film is about 10 μm to about 25 μm, and
- the thickness of the first light transmitting portion is about 2 μm to about 8 μm.

7. The display device of claim 1, wherein the light transmitting film has a refractive index in a range of about 1.1 to about 1.6.

8. The display device of claim 1, wherein
- the light blocking film includes a light blocking organic material, and
- the light transmitting film includes a transparent organic material.

9. The display device of claim 1, further comprising:
- a third light transmitting portion,
- wherein the third light transmitting portion is disposed on the light blocking film and overlaps the light blocking film in the thickness direction of the substrate.

10. The display device of claim 9, wherein the third light transmitting portion is made of photoresist or a transparent conductive oxide.

11. The display device of claim 1, wherein the thickness of the light blocking film is smaller than a thickness of each of the plurality of second light transmitting portions.

12. The display device of claim 1, further comprising:
- a touch layer, wherein
- the touch layer is disposed between the encapsulation layer and the light control layer and includes a plurality of touch electrodes, and
- the light blocking film overlaps the plurality of touch electrodes in the thickness direction of the substrate.

13. The display device of claim 1, further comprising:
- light blocking pattern layers, wherein
- the light blocking pattern layers respectively overlap the light blocking film in the thickness direction of the substrate, and the light blocking pattern layers are positioned on an opposite side of the light blocking film with the first light transmitting portion disposed between the light blocking pattern layers and the opposite side of the light blocking film.

14. The display device of claim 13, wherein the light blocking pattern layers includes at least one of Mo, Al, Ti, W, Ag, Cu, and Au.

15. The display device of claim 1, wherein the light blocking film does not overlap the plurality of light emitting areas in the thickness direction of the substrate.

16. A fingerprint sensor comprising:

a light sensing layer including a light sensing element that generates a sensing current according to incident light; and a light control layer disposed on the light sensing layer, wherein the light control layer includes:

first light transmitting portions spaced apart from each other;

light blocking films respectively overlapping the first light transmitting portions in a thickness direction; and second light transmitting portions disposed between the first light transmitting portions and between the light blocking films, and a thickness of each of the light blocking films is greater than a thickness of each of the first light transmitting portions, wherein a material of the first light transmitting portions is the same as a material of the second light transmitting portions.

* * * * *